(12) United States Patent
Kimura

(10) Patent No.: US 9,704,906 B2
(45) Date of Patent: Jul. 11, 2017

(54) MANUFACTURING METHOD OF SEMICONDUCTOR DEVICE AND SEMICONDUCTOR DEVICE

(71) Applicant: Renesas Electronics Corporation, Tokyo (JP)

(72) Inventor: Masatoshi Kimura, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/341,795

(22) Filed: Nov. 2, 2016

(65) Prior Publication Data

US 2017/0077153 A1 Mar. 16, 2017

Related U.S. Application Data

(62) Division of application No. 14/729,279, filed on Jun. 3, 2015, now Pat. No. 9,515,117.

(30) Foreign Application Priority Data

Jun. 5, 2014 (JP) .................................. 2014-116356

(51) Int. Cl.
*H01L 27/146* (2006.01)
*H04N 5/232* (2006.01)

(52) U.S. Cl.
CPC .... *H01L 27/1463* (2013.01); *H01L 27/14605* (2013.01); *H01L 27/14621* (2013.01); *H01L 27/14627* (2013.01); *H01L 27/14636* (2013.01); *H01L 27/14641* (2013.01); *H01L 27/14645* (2013.01); *H01L 27/14689* (2013.01); *H04N 5/23212* (2013.01)

(58) Field of Classification Search
CPC .......... H01L 27/1463; H01L 27/14605; H01L 27/14621; H01L 27/14627; H01L 27/14636; H01L 27/14641; H01L 27/14645; H01L 27/1469; H04N 5/23212
See application file for complete search history.

(56) References Cited

U.S. PATENT DOCUMENTS

| 5,563,727 | A | 10/1996 | Larson et al. |
| 5,731,131 | A | 3/1998 | Momma et al. |
| 6,387,744 | B2 * | 5/2002 | Taniguchi ......... H01L 21/76229 257/E21.548 |

(Continued)

FOREIGN PATENT DOCUMENTS

| JP | 05-006849 A | 1/1993 |
| JP | 2008-263050 A | 10/2008 |

*Primary Examiner* — John C Ingham
*Assistant Examiner* — Gustavo Ramallo
(74) *Attorney, Agent, or Firm* — Shapiro, Gabor and Rosenberger, PLLC

(57) ABSTRACT

The performance of a solid state image sensor which is formed by performing divided exposure that exposes the entire chip by a plurality of times of exposure and in which each of a plurality of pixels arranged in a pixel array portion has a plurality of photodiodes is improved.
In the divided exposure performed when the solid state image sensor is manufactured, a dividing line that divides an exposure region is defined to be located between a first photodiode and a second photodiode aligned in a first direction in an active region in a pixel and is defined to be along a second direction perpendicular to the first direction.

5 Claims, 16 Drawing Sheets

(56) References Cited

U.S. PATENT DOCUMENTS

| | | | |
|---|---|---|---|
| 7,732,239 B2* | 6/2010 | Kimura | H01L 27/14603 257/E21.133 |
| 2004/0165097 A1 | 8/2004 | Drowley et al. | |
| 2007/0007559 A1* | 1/2007 | Lee | H01L 27/14603 257/239 |
| 2007/0145500 A1* | 6/2007 | Han | H01L 27/14603 257/414 |
| 2008/0053953 A1 | 3/2008 | Yoshibayashi | |
| 2010/0207230 A1* | 8/2010 | Hsu | H01L 27/14689 257/446 |

* cited by examiner

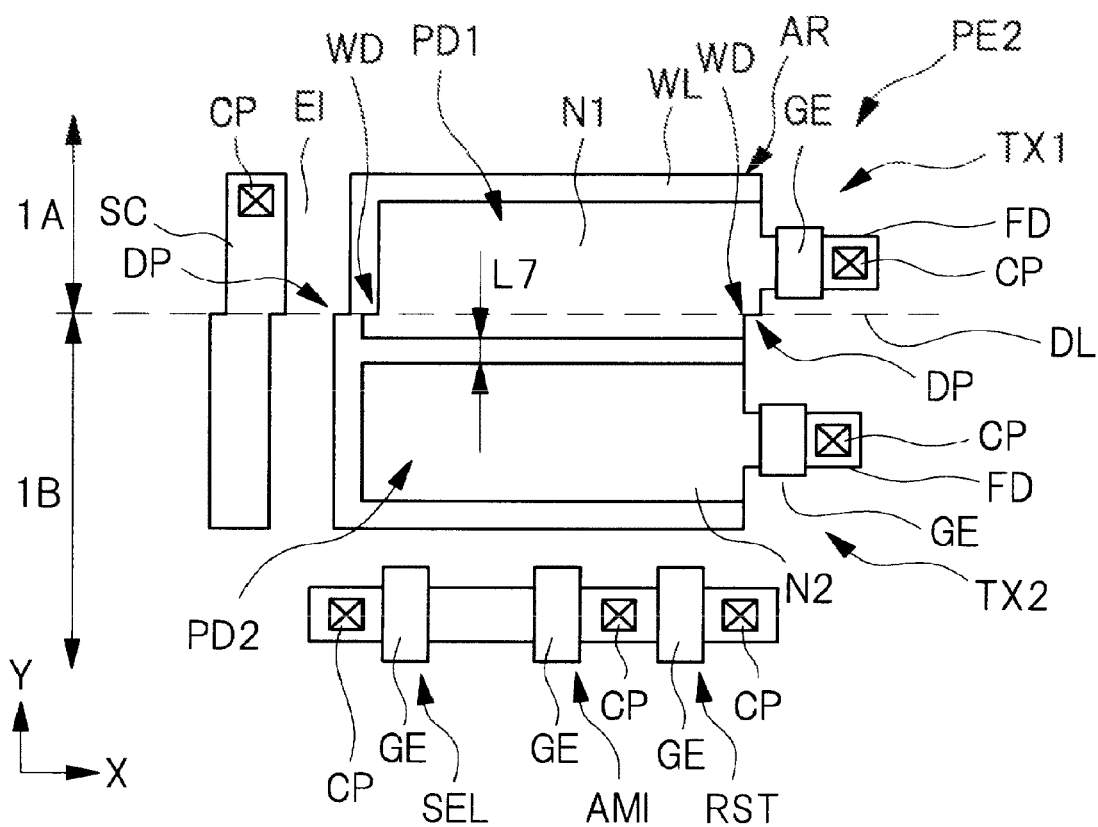

MANUFACTURING METHOD OF SEMICONDUCTOR DEVICE AND SEMICONDUCTOR DEVICE

CROSS-REFERENCE TO RELATED APPLICATION

The disclosure of Japanese Patent Application No. 2014-116356 filed on Jun. 5, 2014 including the specification, drawings and abstract is incorporated herein by reference in its entirety.

BACKGROUND

The present invention relates to a manufacturing method of semiconductor device and a semiconductor device and in particular to an effective technique when applied to a semiconductor device including a solid state image sensor and a manufacturing method thereof.

When an image sensor (picture elements) used for digital camera and the like is formed as an element with a large chip size to obtain a high image quality, the entire chip cannot be exposed by one-time exposure in the manufacturing process of the image sensor, so that a plurality of times of divided exposure processing is performed.

It is known that two or more photodiodes are provided to each of a plurality of pixels included in an image sensor in a solid state image sensor to which an image plane phase difference technique is applied which is used in a digital camera having an automatic focusing system function.

Patent Document 1 (Japanese Patent Laid-Open No. 1993-6849) describes that exposure is performed on a chip with a size too large to expose the entire chip by one mask by dividing the mask to a plurality of masks, and here the Patent Document 1 describes that a dividing position of the mask is defined to a region between a plurality of pixels formed on a main surface of the chip.

Patent Document 2 (Japanese Patent Laid-Open No. 2008-263050) describes that a pixel and a position of a dividing line of the divided exposure is overlapped with each other.

SUMMARY

As the pixel area is increased and/or the number of pixels is increased to improve image quality or the pixel density in the image sensor is increased due to reduction of chip size, it is considered to reduce the width of an element isolation region between adjacent pixels. In this case, when the mask used for exposure is divided at the element isolation region between adjacent pixels as in Patent Document 1, there is a risk that a defect occurs due to a position shift of the mask or a variation in isolation dimension. When the width of the element isolation region is increased, a problem occurs where it is difficult to increase the density of pixels and the performance of semiconductor device degrades.

The other purposes and new features will become clear from the description of the present specification and the accompanying drawings.

The following explains briefly the outline of a typical embodiment among the embodiments disclosed in the present application.

A manufacturing method of semiconductor device, which is an embodiment, defines a dividing position of a mask for exposure in a region between a first photodiode and a second photodiode that are formed in a pixel included in an image sensor.

According to an embodiment disclosed in the present application, it is possible to improve the performance of semiconductor device. In particular, it is possible to achieve a high density of pixels and to prevent variation of pixel characteristics.

BRIEF DESCRIPTION OF THE DRAWINGS

FIG. 18 is a plan layout showing a semiconductor device which is a fourth embodiment of the present invention.

DETAILED DESCRIPTION

Hereinafter, embodiments of the present invention will be described in detail with reference to the drawings. In all the drawings for explaining the embodiments, the same symbol is attached to a member having the same function and the repeated explanation thereof is omitted. In the embodiments described below, explanation of the same or a similar portion is not repeated as a principle, except when the explanation is particularly required.

(First Embodiment)

Hereinafter, a semiconductor device of the present embodiment will be described with reference to FIGS. 1 to 6. The semiconductor device of the present embodiment is related to a solid state image sensor and in particular to a solid state image sensor in which a plurality of photodiodes are included in one pixel.

Figure 1:
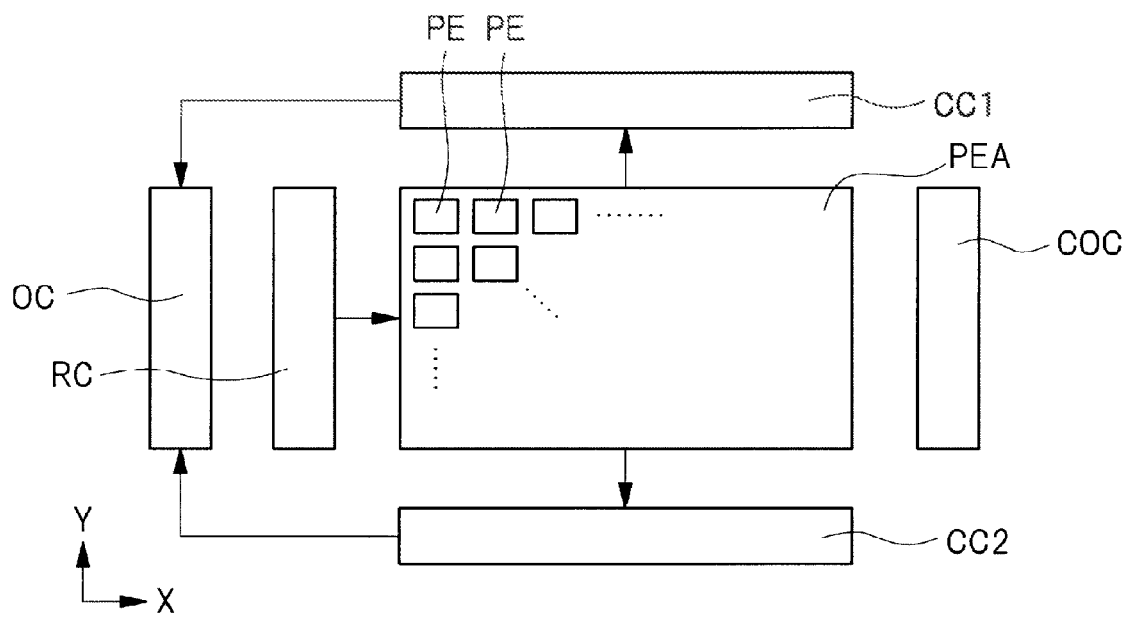
FIG. 1 is a schematic diagram showing a configuration of a semiconductor device which is a first embodiment of the present invention.

FIG. 1 is a schematic diagram showing a configuration of a solid state image sensor according to the present embodiment. The solid state image sensor, which is a semiconductor device of the present embodiment, is a CMOS (Complementary Metal Oxide Semiconductor) image sensor and, as shown in FIG. 1, includes an pixel array portion PEA, read circuits CC1 and CC2, an output circuit OC, a row selection circuit RC, and a control circuit COC.

In the pixel array portion PEA, a plurality of pixels PE are arranged in a matrix form. The X axis direction shown in FIG. 1 is a direction along a main surface of the semiconductor substrate that forms the solid state image sensor and a direction along a row direction in which the pixels PE are arranged. The Y axis direction, which is a direction along the main surface of the semiconductor substrate and is perpendicular to the X axis direction, is a direction along a column direction in which the pixels PE are arranged. In other words, the pixels PE are arranged in a matrix form.

Each of a plurality of pixels PE generates a signal according to the intensity of irradiated light. The row selection circuit RC selects a plurality of pixels PE in a row unit. The pixels PE selected by the row selection circuit RC output a generated signal to an output line OL (see FIG. 2) described later. The read circuits CC1 and CC2 are arranged to face each other in the Y axis direction with the pixel array portion PEA in between. Each of the read circuits CC1 and CC2 reads the signal outputted from the pixels PE to the output line OL and outputs the signal to the output circuit OC.

The read circuit CC1 reads signals of a half of the pixels PE on the read circuit CC1 side and the read circuit CC2 reads signals of the remaining half of the pixels PE on the read circuit CC2 side. The output circuit OC outputs the signals of the pixels PE read by the read circuits CC1 and CC2 to the outside of the solid state image sensor. The control circuit COC integrally manages an operation of the entire solid state image sensor and controls the other components of the solid state image sensor.

Figure 2:
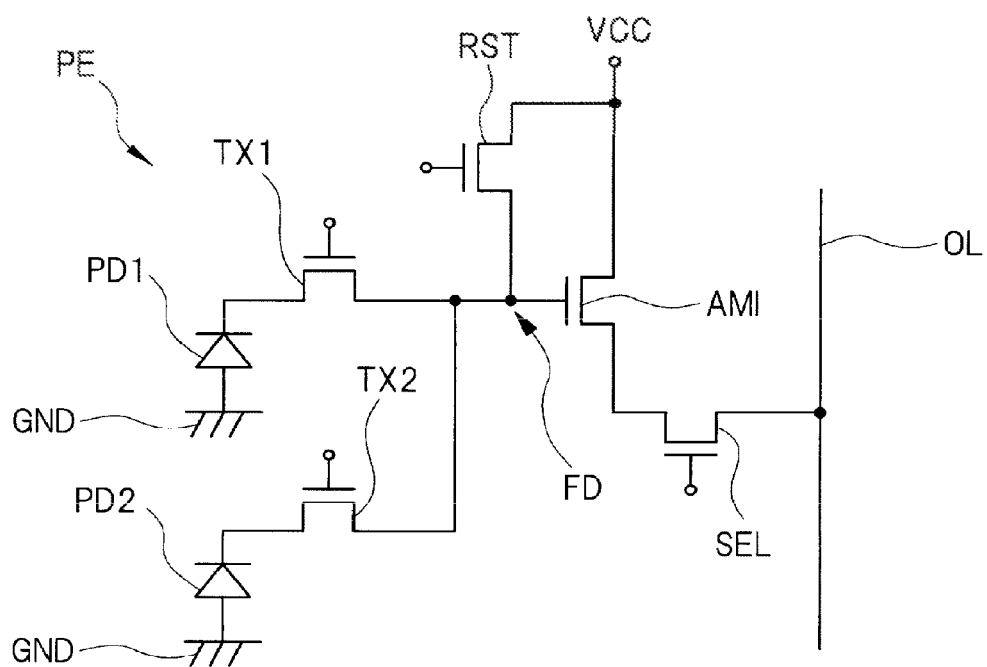
FIG. 2 is an equivalent circuit diagram showing the semiconductor device which is the first embodiment of the present invention.

Next, FIG. 2 shows a circuit of the pixel. Each of the pixels PE shown in FIG. 1 has the circuit shown in FIG. 2. As shown in FIG. 2, the pixel includes photodiodes PD1 and PD2 that perform photoelectric conversion, a transfer transistor TX1 that transfers an electrical charge generated in the photodiode PD1, and a transfer transistor TX2 that transfers an electrical charge generated in the photodiode PD2. The pixel further includes a floating diffusion FD that accumulates the electrical charge transferred from the transfer transistors TX1 and TX2 and an amplifier transistor AMI that amplifies an electrical potential of the floating diffusion FD. The pixel further includes a selection transistor SEL that selects whether or not to output the potential amplified by the amplifier transistor AMI to the output line OL coupled to either one of the read circuits CC1 and CC2 (see FIG. 1) and a reset transistor RST that initializes the cathodes of the photodiodes PD1 and PD2 and the potential of the floating diffusion FD to a predetermined potential. Each of the transfer transistors TX1 and TX2, the reset transistor RST, the amplifier transistor AMI, and the selection transistor SEL is, for example, an N-type MOS transistor.

A ground potential GND, which is a minus-side power supply potential, is applied to the anode of each of the photodiodes PD1 and PD2. The cathodes of the photodiodes PD1 and PD2 are coupled to the sources of the transfer transistors TX1 and TX2, respectively. The floating diffusion FD is coupled to the drain of each of the transfer transistors TX1 and TX2, the source of the reset transistor RST, and the gate of the amplifier transistor AMI. A plus-side power supply potential VCC is applied to the drain of the reset transistor RST and the drain of the amplifier transistor AMI. The source of the amplifier transistor AMI is coupled to the drain of the selection transistor SEL. The source of the selection transistor SEL is coupled to the output line OL coupled to either one of the aforementioned read circuits CC1 and CC2.

Next, an operation of the pixel will be described. A predetermined potential is applied to the gate electrodes of the transfer transistors TX1 and TX2 and the reset transistor RST and all of the transfer transistors TX1 and TX2 and the reset transistor RST turn to ON state. Then, the electrical charge remaining in the photodiodes PD1 and PD2 and the electrical charge accumulated in the floating diffusion FD flow toward the plus-side power supply potential VCC, and the electrical charge of the photodiodes PD1 and PD2 and the floating diffusion FD is initialized. Thereafter, the reset transistor RST turns to OFF state.

Subsequently, incident light is irradiated to PN-junctions of the photodiodes PD1 and PD2 and photoelectric conversion occurs in the photodiodes PD1 and PD2. As a result, an electrical charge occurs in each of the photodiodes PD1 and PD2. All the electrical charge is transferred to the floating diffusion FD by the transfer transistors TX1 and TX2. The floating diffusion FD accumulates the transferred electrical charge. Thereby, the potential of the floating diffusion FD is changed.

Subsequently, when the selection transistor SEL turns to ON state, the changed potential of the floating diffusion FD is amplified by the amplifier transistor AMI and then outputted to the output line OL. Then, one of the read circuits CC1 and CC2 reads the potential of the output line OL. When automatic focusing of an image plane phase difference method is performed, the electrical charge of each of the photodiodes PD1 and PD2 is not transferred to the floating diffusion FD at the same time by the transfer transistors TX1 and TX2, but each electrical charge is sequentially transferred and read, so that the value of the electrical charge is read for each of the photodiodes PD1 and PD2. When imaging is performed, the electrical charge of each of the photodiodes PD1 and PD2 is transferred to the floating diffusion FD at the same time.

Figure 3:
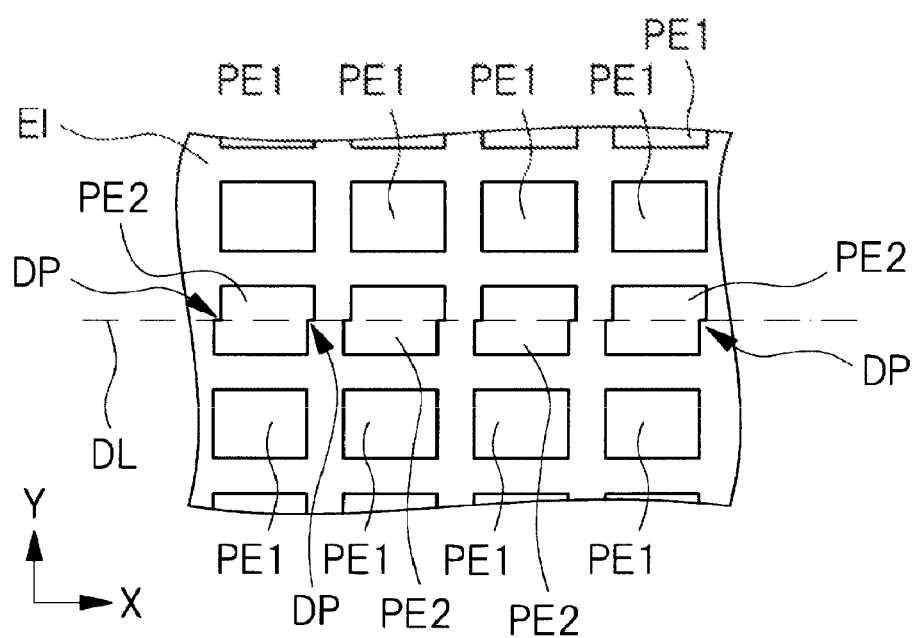
FIG. 3 is a plan layout showing the semiconductor device which is the first embodiment of the present invention.
Figure 4:
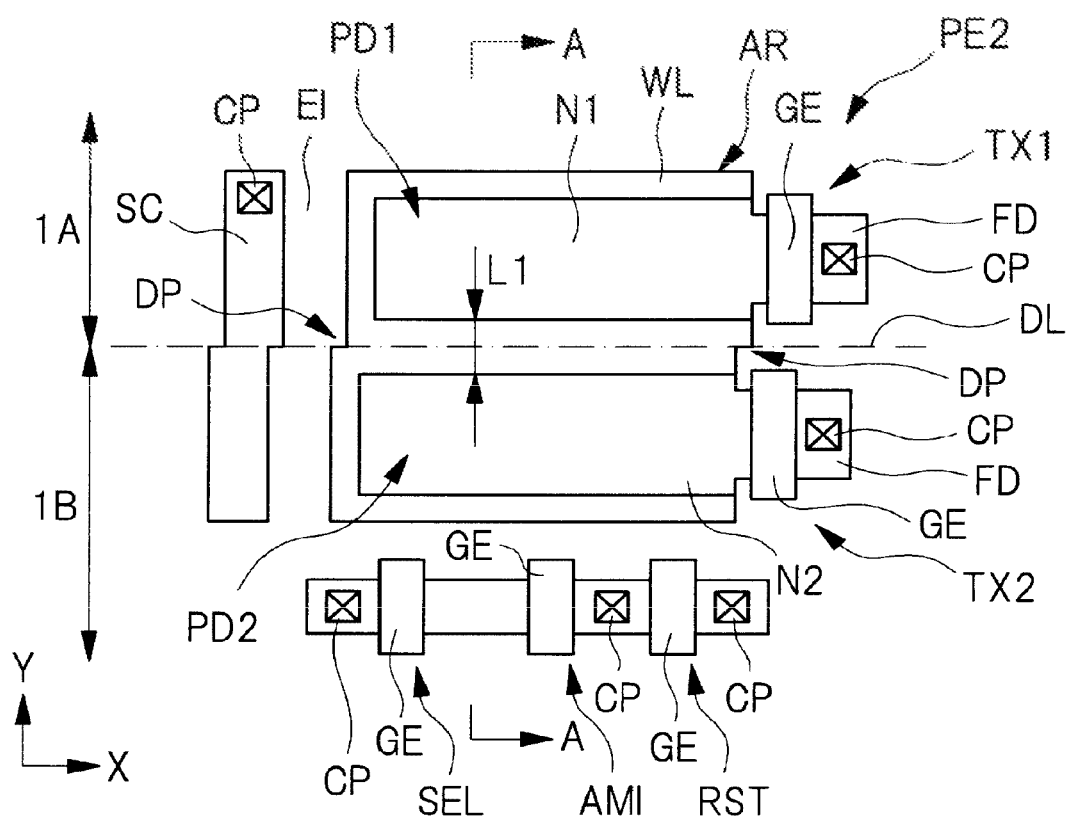
FIG. 4 is a plan layout showing the semiconductor device which is the first embodiment of the present invention.
Figure 5:
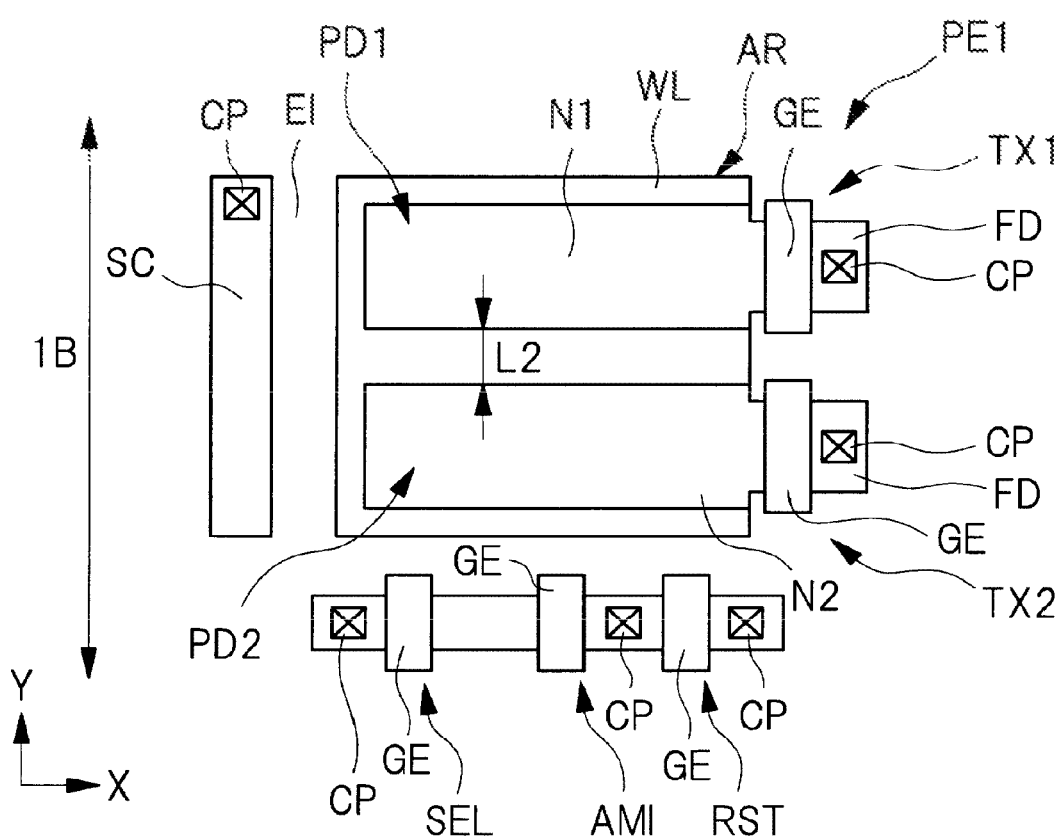
FIG. 5 is a plan layout showing the semiconductor device which is the first embodiment of the present invention.
Figure 6:
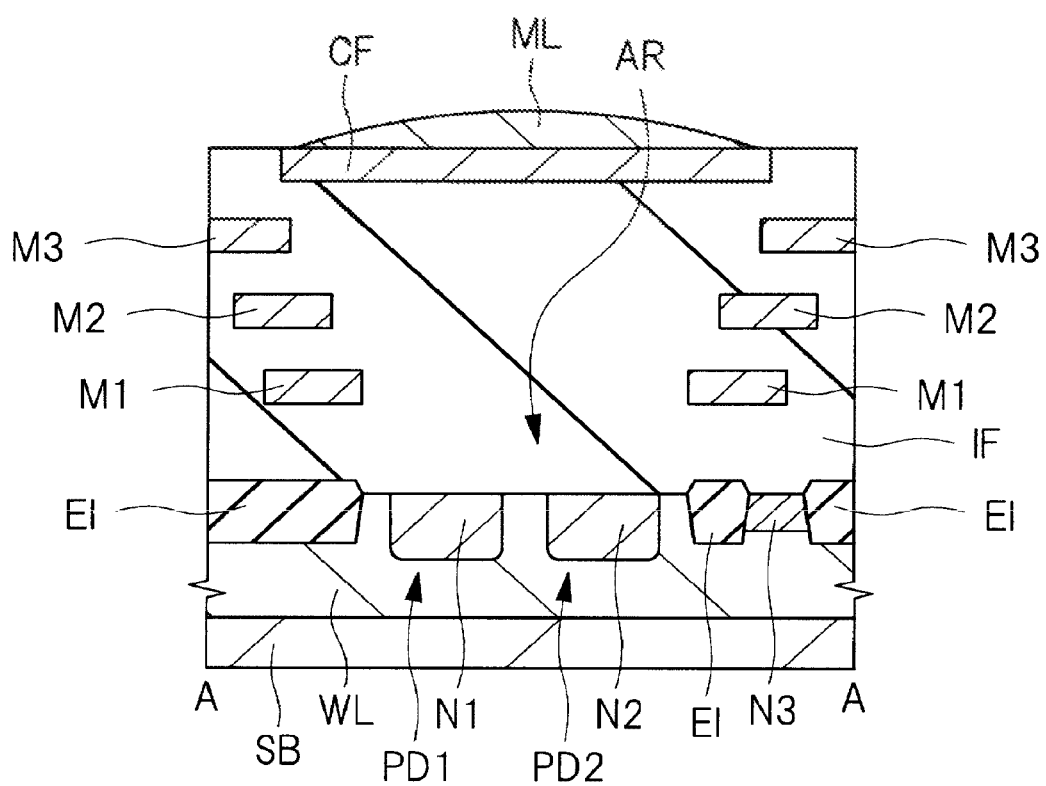
FIG. 6 is a cross-sectional view taken along line A-A in FIG. 4.

Next, FIGS. 3 and 4 show a plan layout of the pixel PE. FIG. 6 shows a cross-sectional view taken along line A-A in FIG. 4. FIG. 3 is a plan layout enlarging and showing apart of the pixel array portion PEA shown in FIG. 1. FIG. 4 is a plan layout enlarging and showing one pixel PE2 shown in FIG. 3. FIG. 5 is a plan layout enlarging and showing one pixel PE1 shown in FIG. 3. In FIGS. 3 to 5, an interlayer insulating film, wiring, a microlens, and the like provided over the photodiodes and the transistors around the photodiodes are omitted. FIG. 3 shows only a schematic diagram of a layout of an active region of a light receiving portion, where the photodiodes are formed, as a layout of each pixel.

As shown in FIG. 3, a plurality of pixels PE1 are arranged in a matrix form in the X axis direction and the Y axis direction in the upper surface of the semiconductor substrate that forms the solid state image sensor. Further, a plurality of pixels PE2 are arranged in a row in the X axis direction in the upper surface of the semiconductor substrate that forms the solid state image sensor. The periphery of each of the pixels PE1 and PE2 is surrounded by an element isolation region (element isolation structure) EI. In other words, the layout of the active region of each pixel is defined by the element isolation region EI around the pixel.

As shown in FIG. 3, regarding the pixels arranged in a matrix form, only one row is formed by the pixels PE2, and the other rows are formed by the pixels PE1. In other words, a plurality of pixels PE2 is arranged in the X axis direction (first direction) and a plurality of pixels PE1 is arranged in the Y axis direction (second direction) with respect to each pixel PE2. In other words, regarding the pixels PE (see FIG. 1) arranged in the pixel array portion PEA, most of the pixels PE are the pixels PE1 and only one row of the pixels PE (see FIG. 1) arranged in the X axis direction in a central portion of the pixel array portion PEA are the pixels PE2.

The pixel PE1 has a substantially rectangular shape in plan view. On the other hand, the pixel PE2 has a shape which is shifted in one direction so that a level difference DP occurs in each of two peripheral sides in parallel to each other of the four sides forming the rectangular shape. The reason why the shift occurs in only a row of pixels PE2 of a plurality of pixels arranged in a matrix form is because the pixels PE2 are located on a dividing line between exposure regions of two masks used in a process for forming the solid state image sensor.

As shown in FIG. 4, most of the area of one pixel PE2 is occupied by the light receiving portion where the photodiodes PD1 and PD2 are formed. In this manner, one pixel PE2 includes two photodiodes. Specifically, in plan view, one microlens ML (see FIG. 6) and two photodiodes PD1 and PD2 are arranged to be overlapped with each other.

In the pixel PE2, a plurality of peripheral transistors and a substrate contact portion SC are arranged around the light receiving portion, and the periphery of an active region of each of the light receiving portion, the peripheral transistors, and the substrate contact portion SC is surrounded by the element isolation region EI. The peripheral transistors mentioned here are the reset transistor RST, the amplifier transistor AMI, and the selection transistor SEL.

Each peripheral transistor is formed in the same active region and the active region extends in the X axis direction along one side of an active region AR of the light receiving portion. An active region where the substrate contact portion SC is formed extends in the Y axis direction along another side of the active region AR of the light receiving portion. Along another side of the active region AR, to which the peripheral transistors and the substrate contact portion SC are not adjacent, the transfer transistor TX1 whose source region is the photodiode PD1 of the active region AR and the transfer transistor TX2 whose source region is the photodiode PD2 of the active region AR are formed.

Each peripheral transistor and the transfer transistors TX1 and TX2 have a gate electrode GE extending along the Y axis direction. The gate electrode GE is formed of, for example, polysilicon and is formed over the semiconductor substrate through a gate insulating film (not shown in the drawings).

In the active region where the peripheral transistors are formed, the reset transistor RST, the amplifier transistor AMI, and the selection transistor SEL are sequentially arranged in order in the X axis direction. The reset transistor RST and the amplifier transistor AMI share their drain regions. The source region of the reset transistor RST is coupled to the drain region of each of the transfer transistors TX1 and TX2, that is to say, coupled to the floating diffusion FD. The source region of the amplifier transistor AMI functions as a drain region of the selection transistor SEL. The source region of the selection transistor SEL is coupled to the output line OL as described using FIG. 2.

As shown in FIG. 4, the drain region of each of the transfer transistors TX1 and TX2, the source region of the selection transistor SEL, the source region of the reset transistor RST, and the drain region of the amplifier transistor AMI are $N^+$-type semiconductor regions formed in the main surface of the semiconductor substrate, and the substrate contact portion SC is a $P^+$-type semiconductor region formed in the main surface of the semiconductor substrate. A contact plug CP is coupled to the upper surface of each of these semiconductor regions. Although not shown in the drawings, a contact plug is coupled to the upper surface of each of a plurality of gate electrodes GE.

The substrate contact portion SC is a region to which the ground potential GND (see FIG. 2) is applied and has a role to prevent variation of threshold voltage of the peripheral transistors from occurring by fixing the potential of a well in the upper surface of the semiconductor substrate.

Both the photodiode (first photodiode) PD1 and the photodiode (second photodiode) PD2 that are arranged in the Y axis direction in the active region AR, which is the light receiving portion, are semiconductor elements extending in the X axis direction. In other words, the longitudinal direction of each of the photodiodes PD1 and PD2 is along the X axis direction.

As described later, the photodiode PD1 includes an $N^-$-type semiconductor region N1 formed in the main surface of the semiconductor substrate and a well region WL that is a P-type semiconductor region. In the same manner, the photodiode PD2 includes an $N^-$-type semiconductor region N2 formed in the main surface of the semiconductor substrate and a well region WL. The photodiodes PD1 and PD2 that are light receiving elements shown in FIG. 4 can be assumed to be formed in formation regions of the $N^-$-type semiconductor regions N1 and N2. In the active region AR, a $P^-$-type well region WL is formed in a region other than the regions in which the $N^-$-type semiconductor regions N1 and N2 are formed.

Although the active region AR has a shape close to a rectangle in plan view, two protrusion portions are formed on one side of the four sides of the rectangle. Regarding these protrusion portions, the drain region of the transfer transistor TX1 is formed in one protrusion portion and the drain region of the transfer transistor TX2 is formed in the other protrusion portion. The gate electrode GE is arranged so as to straddle each of the two protrusion portions.

On one side, where the protrusion portions are formed, of the active region AR, the level difference DP is formed at the central portion of the side, and in the same manner, the level difference DP is also formed on another side in parallel with the one side, that is, on the side facing the substrate contact portion SC. The level differences DP on the two sides are formed at positions overlapping with a predetermined straight line in plan view. In FIG. 4, the straight line is indicated by a dashed-dotted line. Further, the level differences DP are also formed at positions overlapping with the straight line in plan view on peripheral sides of the active region AR of the other pixels PE2 (see FIG. 3) arranged in the X axis direction. The straight line indicates a dividing line between regions respectively exposed by two different masks when exposure is performed on a photoresist mask in a photolithography process for forming the element isolation region EI and defining the active region AR.

In the description below, the straight line overlapping with a plurality of level differences DP in plan view may be simply referred to as a dividing line DL. As shown in FIG. 3, although the dividing line DL overlaps with all the pixels PE2 in a specific row, the dividing line DL does not overlap with the pixels PE1 in the other rows. Here, the feature of the present embodiment is that, as shown in FIG. 4, the dividing line DL connecting the two level differences DP on the periphery of the active region AR is located between the photodiodes PD1 and PD2 adjacent to each other in one pixel PE2. In other words, the dividing line DL overlaps with neither the photodiode PD1 nor the photodiode PD2 in plan view and overlaps with only the well region WL in the active region AR. So the dividing line DL overlaps with only a semiconductor region of one conductivity type (P-type) in the active region AR in plan view.

In other words, in the pixel PE2, the photodiodes PD1 and PD2 lining up in the Y axis direction are formed, and each of the two level differences DP on the periphery of the active region AR does not line up with the photodiodes PD1 and PD2 in the X axis direction perpendicular to the Y axis direction and is formed to line up with an region between the photodiode PD1 and the photodiode PD2. Specifically, in one pixel PE2, there are the photodiode PD1, an intermediate region, and the photodiode PD2 in order in the Y axis direction, and in the X axis direction perpendicular to the Y axis direction, the level difference DP is formed in each of the peripheral sides of the active region AR adjacent to both sides of the intermediate region.

The dividing line DL is a straight line connecting the level differences DP formed on the periphery of the active region AR of each of the pixels PE2. The dividing line DL extends in the X axis direction, that is, the longitudinal direction of each of the photodiodes PD1 and PD2. On the periphery of the substrate contact portion SC, a level difference is formed at a position overlapping with the dividing line DL.

Here, FIG. 5 shows a plan layout of the pixel PE that does not overlap with the dividing line DL. As shown in FIG. 5, each pixel PE1 has the same configuration as that of the pixel PE2 except for a point that the level difference DP is not formed in the active region AR, a point that a level difference is not formed in the substrate contact portion SC, and a point that each pixel PE1 does not overlap with the dividing line DL, and each pixel PE1 includes two photodiodes in the active region AR, which is a light receiving portion. As a result, the shape in plan view of the active region AR of the pixel PE1 has a rectangular shape having two protrusion portions on one side to which the transfer transistors TX1 and TX2 are adjacent and no level difference is formed on the periphery of the active region AR except for the protrusion portions.

Here, the distance between the photodiodes PD1 and PD2 adjacent to each other in the pixel PE1 is the same as that in the pixel PE2 (see FIG. 4). In other words, the distance L1 between the photodiode PD1 and the photodiode PD2 in the pixel PE2 shown in FIG. 4 is the same as the distance L2 between the photodiode PD1 and the photodiode PD2 in the pixel PE1 shown in FIG. 5. Further, the areas and dimensions of the photodiodes PD1 and PD2 of the pixel PE1 are the same as those of the pixel PE2 (see FIG. 4).

The reason why a plurality of photoelectric conversion portions (for example, photodiodes) are provided in one pixel in the solid state image sensor is because, for example, it is possible to improve the accuracy and the speed of focusing when the solid state image sensor of the present embodiment is used for a digital camera having an automatic focusing system of an image plane phase difference type. In such a digital camera, it is possible to realize a short time focusing by calculating a driving amount of lens required for the focusing from the amount of shift, that is, the phase difference, between a signal detected by one photodiode and a signal detected by the other photodiode in the pixel. Therefore, it is possible to form a larger number of very small photodiodes in the solid state image sensor by providing a plurality of photodiodes in a pixel, so that it is possible to improve the accuracy of the automatic focusing.

When a captured image is outputted, two photodiode signals (electrical charges) in a pixel are collectively outputted as a single signal. Thereby, it is possible to obtain an image of the same quality as that of a solid state image sensor including a plurality of pixels, each of which has only one photodiode.

FIG. 6 shows a cross-sectional view taken along a direction in which the photodiodes PD1 and PD2 line up in one pixel PE2 (see FIG. 4). In the cross-sectional view shown in FIG. 6, boundaries between a plurality of interlayer insulating films laminated over the semiconductor substrate SB are omitted. As shown in FIG. 6, a P$^-$-type well region WL is formed in the upper surface of the semiconductor substrate SB formed of N-type single crystal silicon or the like. The element isolation region EI that isolates the active region AR from the other active regions is formed over the well region WL. The element isolation region EI is formed of, for example, a silicon oxide film and is buried in a groove formed in the upper surface of the semiconductor substrate SB.

In the upper surface of the well region WL, the N$^-$-type semiconductor regions N1 and N2 and an N$^+$-type semiconductor region N3 are formed and separated from each other by the element isolation region EI. The N$^+$-type semiconductor region N3 functions as the source region of the amplifier transistor AMI and the drain region of the selection transistor SEL. The well region WL, which forms a PN junction with the N$^-$-type semiconductor region N1, functions as the anode of the photodiode PD1. The well region WL, which forms a PN junction with the N$^-$-type semiconductor region N2, functions as the anode of the photodiode PD2. The N$^-$-type semiconductor region N1 and the N$^-$-type semiconductor region N2 are provided in one active region AR sandwiched by the element isolation regions EI.

In this way, in the active region AR formed in the pixel, the photodiode PD1 formed of the N$^-$-type semiconductor region N1 and the well region WL and the photodiode PD2 formed of the N$^-$-type semiconductor region N2 and the well region WL are formed. In the active region AR, the photodiodes PD1 and PD2 are arranged side by side with a region in between where the well region WL is exposed in the upper surface of the semiconductor substrate SB. The well region WL in the upper surface of the semiconductor substrate SB between the photodiode PD1 and the photodiode PD2 overlaps with the dividing line DL shown in FIG. 4 in plan view. The formation positions of the N$^-$-type semiconductor regions N1 and N2 correspond to the formation positions of the photodiodes PD1 and PD2 in FIG. 4, respectively. The portions where the N$^-$-type semiconductor regions N1 and N2 are formed function as the photoelectric conversion portions.

The formation depth of the N$^-$-type semiconductor regions N1 and N2 is smaller than the formation depth of the well region WL. The depth of the groove in the upper surface of the semiconductor substrate SB in which the element isolation region EI is buried is smaller than the formation depth of the N$^-$-type semiconductor regions N1 and N2. The formation depth of the N$^+$-type semiconductor region N3 is smaller than the depth of the groove in the upper surface of the semiconductor substrate SB in which the element isolation region EI is buried.

An interlayer insulating film IF is formed over the semiconductor substrate SB so as to cover the element isolation region EI and the photodiodes PD1 and PD2. The interlayer insulating film IF is a laminated film in which a plurality of insulating films are laminated. A plurality of wiring layers are laminated in the interlayer insulating film IF and a wiring M1 covered by the interlayer insulating film IF is formed in the lowest wiring layer. A wiring M2 is formed over the wiring M1 through the interlayer insulating film IF and a wiring M3 is formed over the wiring M2 through the interlayer insulating film IF. A color filter CF is formed over the interlayer insulating film IF and a microlens ML is formed over the color filter CF. When the solid state image sensor is operated, light is irradiated to the photodiodes PD1 and PD2 through the microlens ML and the color filter CF.

No wiring is formed immediately above the active region AR including the photodiodes PD1 and PD2. The reason of this is to prevent light entering from the microlens ML from being blocked by wiring and not being irradiated to the photodiodes PD1 and PD2, which are the light receiving portions of the pixel. Conversely, the wirings M1 to M3 are arranged in a region other than the active region AR, so that it is prevented that the photoelectric conversion occurs in the active region where the peripheral transistors and the like are formed.

Here, in addition to the exposure processing in a formation process of the active region AR and the element isolation region EI shown in FIG. 4, the N$^-$-type semiconductor regions N1 and N2, the gate electrode GE (see FIG. 4), the interlayer insulating film IF, and the wirings M1 to M3, and the like shown in FIG. 6 are also formed by a plurality times of exposure processing by divided exposure, and the exposure processing is performed on different exposure regions divided by the dividing line DL. In other words, in any process such as an ion implantation process for forming the N$^-$-type semiconductor regions N1 and N2 and the like and a formation process of contact hole in which a contact plug is buried, it is possible to define the dividing position of the exposure processing at a position that overlaps with a region between the photodiode PD1 and the photodiode PD2 included in each of the pixels PE2 aligned in a row.

As a result, the plan layout of each of the N$^-$-type semiconductor regions N1 and N2, the gate electrode GE, the contact hole, the wirings M1 to M3, and the like has a shape in which a first region and a second region, which sandwich the dividing line DL, are shifted from each other.

In a formation process of each of the N$^-$-type semiconductor regions N1 and N2, the gate electrode GE, the contact hole, the wirings M1 to M3, and the like, regarding the management of position shift of a mask, it is possible to reduce variation in performance of the solid state image sensor by managing only a position shift of an overlay (overlap) manufacturing error in each process with respect to the dividing position of the active region AR. Therefore, it is easy to prevent degradation of performance of the semiconductor device.

FIG. 4 shows a structure in which the photodiode PD2 is formed at a position shifted from the photodiode PD1 in the same direction as that of the shift of the layout of the active region AR by the divided exposure. However, a pattern of the active region AR and a pattern of the photodiodes PD1 and PD2 are formed by different exposure processes using different masks, respectively, so that these patterns are not necessarily shifted and formed by the same shift amount in the same direction. In other words, the active region, the semiconductor region, the gate electrode, the wirings, and the like, the patterns of which are formed in different processes, are not shifted and formed in the same direction by the position shifts of masks, but shifted and formed in various directions with respect to a boundary which is a line close to the dividing line DL.

Hereinafter, problems when setting the dividing region of the exposure processing between pixels, and the features and effects of the semiconductor device of the present embodiment will be described.

In a manufacturing process of a semiconductor device having a large chip area such as a solid state image sensor, a range that can be exposed by one mask is limited, so that there is a case in which the entire region of one chip in a semiconductor wafer cannot be exposed by one-time exposure using one mask, that is to say, by one-time shot. In this case, for example, the entire region of one chip is exposed by performing exposure twice using two masks. In such a divided exposure, that is to say, exposure processing by joint exposure, for example, a first region of one chip region is exposed by a first shot and a second region of the one chip region is exposed by a second shot. A photoresist film over the semiconductor substrate is exposed and developed in this manner, so that a predetermined resist pattern is formed and a semiconductor device is manufactured.

Here, it can be considered to set the position where the exposure is performed in a divided manner, that is, a boundary between the first region and the second region described above, to a position that overlaps with the element isolation region between a plurality of pixels formed in the solid state image sensor. In other words, it can be considered to prevent the dividing line of the divided exposure, that is, a coupling portion of the joint exposure, from overlapping with pixels.

However, when the dividing line of the divided exposure is located in a region overlapping with only the region where the element isolation region is formed, the size of the element isolation region formed in the region overlapping with the dividing line may be small due to a position shift between two types of masks respectively used when exposing two exposure regions sandwiching the dividing line. When a fine dimensional pattern layout is arranged at an edge portion (mask edge) of an exposure mask, it can be considered that a dimensional controllability of a pattern formed at the mask edge is degraded in a process of creating the mask. As a result, when the exposure is performed by using the mask, the dimensional accuracy of a pattern near the dividing position of the exposure processing over the semiconductor substrate is degraded and a dimensional difference (an area difference) occurs between a plurality of photoelectric conversion portions in one pixel, so that there is a risk that an imaging performance or an automatic focus detection function is degraded. In other words, as described above, even if a mask position shift does not occur during the exposure, when the dimensional accuracy of a pattern that forms pixels near the dividing line is degraded due to low accuracy of pattern formation at the mask edge, defining the dividing line between pixels causes degradation of insulation properties between pixels.

By these reasons, when defining the dividing line between pixels, the electrical insulation between elements by the element isolation region is not sufficiently ensured, so that there is a risk to cause performance degradation or malfunction of the solid state image sensor. In particular, when the number of pixels in the solid state image sensor increases, a plurality of pixels are densely arranged accordingly, so that it is required to reduce the size of the element isolation region between pixels. Therefore, high accuracy is required for the size of the element isolation region. However, when the dividing line of the divided exposure is located between pixels adjacent to each other, the distance between the pixels cannot be maintained at a predetermined distance, so that leakage between the pixels, that is, cross talk, becomes significant and the imaging performance of the solid state image sensor is largely degraded. When leakage occurs between the pixels, it is very difficult for the photodiode to perform an electric charge accumulation operation.

The main reason why the leakage between pixels easily occurs in this way is because a potential difference between pixels adjacent to each other is large during an operation such as imaging. When a shift of exposure position occurs at the dividing line by the divided exposure due to a large potential difference between pixels and the width of the element isolation region decreases, the leakage between pixels easily occurs. In particular, an electrical potential higher than that of the photoelectric conversion portions in a pixel is applied to the peripheral transistors included in the pixel, so that when a photodiode of a predetermined pixel and a peripheral transistor of another pixel are close to each other, leakage easily occurs.

On the other hand, assuming that patterns respectively formed in two exposure regions that sandwich the dividing line shift from each other due to a shift in positioning of the mask, it can be considered that the width of the element isolation region between pixels is set to relatively large in advance to ensure a margin for the position shift. However, in this case, the density of pixels in the solid state image sensor decreases, so that the area of the light receiving portion decreases and there is a problem that the quality of images obtained by the imaging is degraded, and the like. Further, it can be considered to increase the width of only an element isolation region, with which the dividing line overlaps, in the element isolation region in the pixel array portion. However, in this case, the arrangement of a plurality of pixels arranged in a matrix form is uneven, so that it is difficult to obtain an accurate image by the solid state image sensor.

The degradation of image quality is difficult to be a problem in a digital camera, the main purpose of which is to capture a moving image. However, a digital camera incorporated with a large-sized solid state image sensor where the entire range of the chip cannot be exposed by one-time exposure is mainly used to capture a still image rather than a moving image in the same manner as, for example, a digital single lens reflex camera. It is considered that an image quality higher than that of a moving image is required for a still image, so that for a large-sized solid state image sensor, the degradation of performance of the solid state image sensor caused by defining the dividing line of the divided exposure between pixels is a large problem.

Therefore, in the semiconductor device of the present embodiment, when the first region and the second region of a region to be one solid state image sensor in the main surface of the semiconductor substrate are separately exposed, the boundary between the first region and the second region is defined to overlap with an region between regions where the first photodiode and the second photodiode are formed respectively in a pixel. In other words, the dividing line is not defined to overlap with the element isolation region between pixels, but is defined at a position which overlaps with a pixel and does not overlap with two photodiodes in the pixel and which is between the photodiodes.

In other words, in the solid state image sensor of the present embodiment that is formed by separately exposing each of the first region and the second region in the upper surface of the substrate, the first photodiode and the second diode in a pixel which the dividing line between the first region and the second region straddles are away from each other with the dividing line in between.

When the solid state image sensor is formed by determining the position of the dividing line and then performing the divided exposure in this way, as shown in FIGS. 3 and 4, the active region AR which is the light receiving portion of the pixel PE2 has a shape in which each of two sides in parallel with each other somewhat shifts in a specific direction at a position, where each of the sides overlaps with the dividing line DL, in plan view. Therefore, the level difference DP occurs in each of the two sides.

In other words, a portion formed in the first region and a portion formed in the second region in the active region AR are formed to be shifted from each other in one direction in plan view. Therefore, on the boundary between the first region and the second region, the level difference DP occurs in the layout of the periphery of the active region AR in plan view.

In other words, a fact that pixels arranged in a matrix form in the pixel array portion have a layout that shifts in a specific direction along a line that overlaps with a row of pixels of the pixels as in the solid state image sensor that is the semiconductor device of the present embodiment means that the solid state image sensor is formed by using the divided exposure processing and the divided position of the exposure overlaps with the row of pixels. As shown in FIG. 4, in a completed layout of the pixel PE2, the level difference DP occurs in each of the two sides on the periphery of the active region AR and the dividing line DL that connects the two level differences DP does not overlap with the photodiodes PD1 and PD2. From this, it is known that the dividing position is defined so that the dividing line of the divided exposure is located between regions where the first photodiode and the second photodiode are respectively formed.

If there is no shift in the positioning of the masks in the exposure processing that is performed a plurality of times in the divided exposure, the level difference DP does not occur in the layout of the formed pixel. However, it is very difficult to set the position of the mask without a shift, so that a plurality of level differences DP are formed along the dividing line DL as shown in FIGS. 3 and 4.

As compared with a case in which the dividing line is defined between pixels adjacent to each other, it is possible to prevent the insulation between elements from degrading due to a variation of the size of the element isolation region EI between pixels by defining the dividing line DL of the divided exposure at a region overlapping with the pixel PE2 as in the present embodiment. Further, it is not necessary to secure a large margin of the size by considering the variation of the size of the element isolation region EI between pixels, so that it is possible to improve the performance of the solid state image sensor by reducing the size of the element isolation region EI and increasing the area of the pixel. Further, it is not necessary to increase a margin of the size of only the element isolation region EI that overlaps with the dividing line by considering the variation of the size of the element isolation region EI between pixels, so that it is possible to prevent the variation of the size of the element isolation region EI in a pixel array region.

In the present embodiment, it can be considered that a position shift of a pattern occurs in a region that overlaps with the active region AR by overlapping the dividing line DL with the pixel PE2 and the distance between the photodiodes PD1 and PD2 decreases. However, when the solid state image sensor is operated, a potential difference between the photodiodes PD1 and PD2 in the pixel PE2 is smaller than a potential difference between pixels adjacent to each other. Therefore, even when the distance between the photodiodes PD1 and PD2 decreases, it is possible to more prevent leakage from occurring than in a case in which a distance between pixels decreases, by defining the dividing line of the divided exposure between pixels as described above.

It is possible to prevent leakage in this way in both cases in which a position shift of a photodiode occurs due to a shift in the positioning of a mask and the accuracy of the size of a photodiode formed by exposing a mask pattern near a mask edge is degraded due to low manufacturing accuracy of the mask edge. Therefore, it is possible to reduce the width of the element isolation region EI between pixels while preventing leakage between pixels, so that it is easy to densely arrange pixels in the solid state image sensor.

Even when leakage occurs between the photodiodes PD1 and PD2 in the pixel PE2, the photodiodes PD1 and PD2 operate as one photodiode, so that there is no change in an image obtained by the image sensor as compared with a case in which the leakage does not occur. Therefore, in the semiconductor device of the present embodiment, it is possible to prevent the imaging performance of the solid state image sensor from degrading as compared with a case in which the dividing line is defined between pixels as described above.

When the dividing line of the divided exposure is defined between pixels, even if patterns adjacent to each other, which are formed by different exposure processes, are formed at positions shifted from each other along a boundary which is the dividing position of the exposure processing, a shift like a level difference is not formed in the element isolation region between pixels. Therefore, it is difficult to visually observe a shift between patterns generated by the divided exposure by a SEM (Scanning Electron Microscope) observation or the like. Therefore, it is difficult to form a pattern of the gate electrode, the contact hole, the wiring, or the like, which are formed after a process of defining the active region, at a position according to the formation position of the active region that is formed first. Thereby, there is a risk that the performance of the solid state image sensor varies.

On the other hand, in the present embodiment, the level difference DP is formed at the boundary between the active region AR and the element isolation region EI by performing the divided exposure at the position described above. It is easy to visually observe the level difference DP, that is, the shift. For example, when an exposure divided into two stages is performed, it is considered that a dimensional error at an edge portion is greater than that at a center portion in each exposure region. Even in such a case, it is easy to visually observe the level difference DP at an edge portion position of an image area of the exposure region by a size measurement process or the like after each exposure processing.

Therefore, the level difference DP is easily detected by the SEM observation or the like when a dimensional inspection or the like is performed. As a result, it is possible to efficiently manage the dimensions of the level difference DP. Thereby, it is possible to suppress a position shift of an impurity implantation region or a shift of formation position of the gate electrode GE and the like with respect to the active region which is formed by the divided exposure and whose position is shifted. Therefore, it is possible to improve the performance of the solid state image sensor.

Further, in the present embodiment, it is possible to increase the density of pixels and increase the number of photodiodes provided in the pixel array portion, so that it is possible to perform the automatic focus detection quickly and accurately. When capturing a moving image by a digital camera, in particular, it is important to quickly perform the automatic focus detection, so that it is possible to improve a moving image capturing function in a digital camera that uses the solid state image sensor of the present embodiment.

From the above, in the present embodiment, it is possible to improve the imaging performance and the automatic focus detection performance of the solid state image sensor, so that it is possible to improve the performance of the semiconductor device.

In the present embodiment, a case is described in which a P-type well region is used as an anode and a diffusion layer, which is an N$^-$-type semiconductor region, is used as a cathode in a photodiode. However, it is not limited to this, and it is possible to obtain the same effect in a solid state image sensor having a photodiode including an N-type well and a P$^-$-type diffusion layer in the N-type well or a photodiode in which a diffusion layer whose conductivity type is the same as that of a pixel well is present in a surface of the N-type well and the P$^-$-type diffusion layer. The type of the solid state image sensor is not limited to the CMOS image sensor. Even when the solid state image sensor is a CCD (Charge Coupled Device), it is possible to obtain the effect described above by realizing the same structure.

Figure 7:
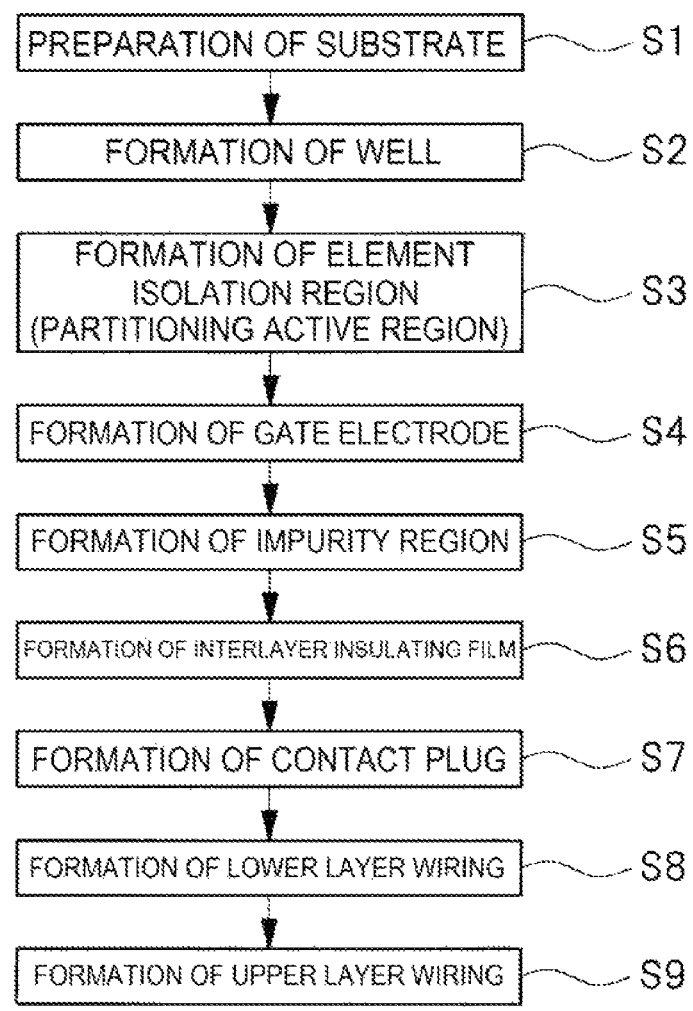
FIG. 7 is a flowchart showing a manufacturing process of the semiconductor device which is the first embodiment of the present invention.
Figure 8:
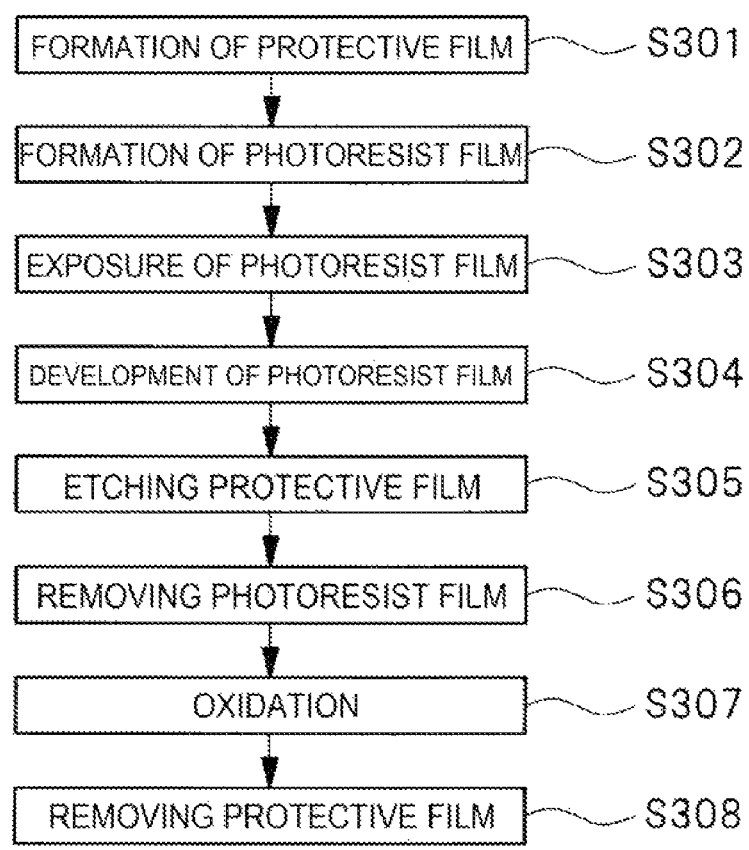
FIG. 8 is a flowchart showing a manufacturing process of the semiconductor device which is the first embodiment of the present invention.

Next, a manufacturing method of the solid state image sensor, which is the semiconductor device of the present embodiment, will be described with reference to FIGS. 3 to 13. FIGS. 7 and 8 are flowcharts showing the manufacturing method of the solid state image sensor according to the present embodiment. FIGS. 9 to 13 are plan views of the semiconductor device of the present embodiment in a manufacturing process. Hereinafter, a manufacturing method of a pixel will be mainly described.

First, a semiconductor substrate including a plurality of regions to be semiconductor chips is prepared (step S1 in FIG. 7). Subsequently, a well region WL (see FIG. 11) is formed in the main surface of the semiconductor substrate by implanting P-type impurities (for example B (boron)) into the main surface of the semiconductor substrate by an ion implantation method or the like (step S2 in FIG. 7).

Subsequently, an active region that forms each of a plurality of pixels in the pixel array portion is partitioned in the upper surface of the semiconductor substrate by forming an element isolation region over the well region by using a photolithography technique (step S3 in FIG. 7). At this time, an active region in a region where the read circuits CC1 and CC2, the output circuit OC, and the like (see FIG. 1) outside the pixel array portion are formed is also partitioned in the main surface of the semiconductor substrate. Here, a process for defining the active region by forming the element isolation region will be described in detail with reference to FIGS. 8 to 11.

FIG. 8 is a flowchart showing in detail a plurality of processes performed in the process for forming the element isolation region in step S3 in FIG. 7. FIG. 8 shows a flowchart for forming the element isolation region formed of a silicon oxide film by a LOCOS (local oxidation of silicon)

method. The element isolation region EI may be formed by an STI (shallow trench isolation) method.

Figure 9:
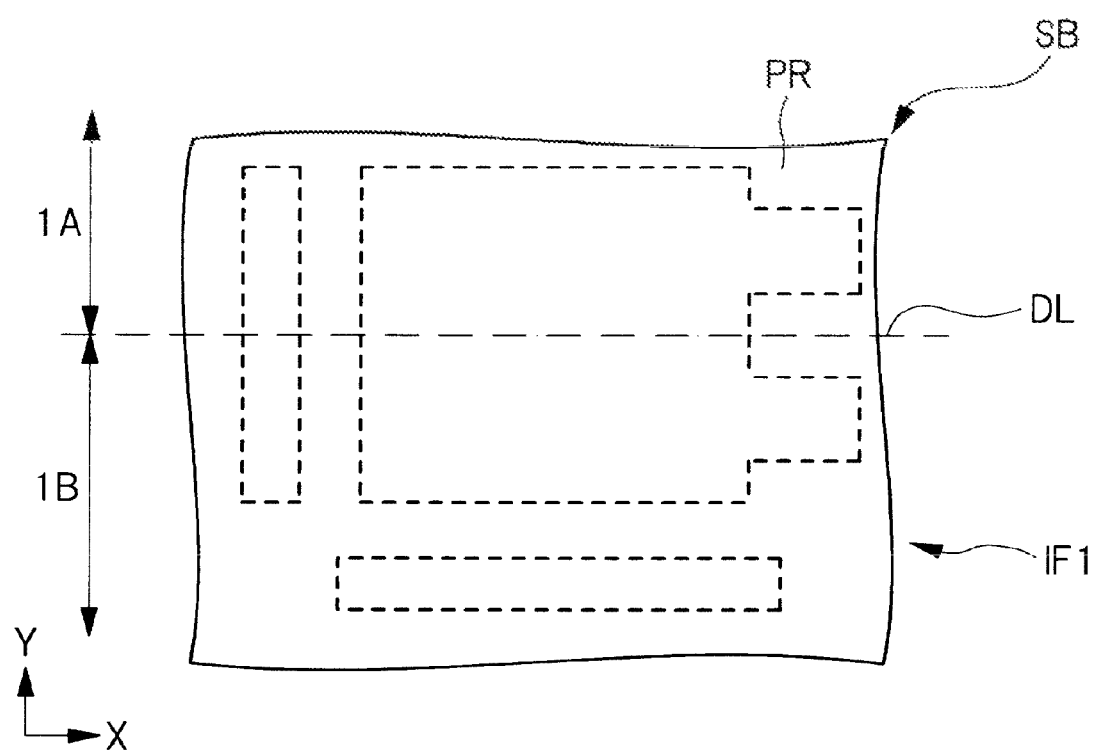
FIG. 9 is a plan view for explaining a manufacturing process of the semiconductor device which is the first embodiment of the present invention.

First, as shown in FIG. 9, a protective film IF1 having a laminated structure of a silicon oxide film and a silicon nitride film is formed over the semiconductor substrate SB (step S301 in FIG. 8). Subsequently, the photoresist film PR is formed over the protective film IF1 (step S302 in FIG. 8). In the plan view shown in FIG. 9, the protective film IF1 covered by the photoresist film PR, the well region WL, and the semiconductor substrate SB are not shown.

Subsequently, the photoresist film PR is exposed by using two photomasks in which a predetermined mask pattern is formed (step S303 in FIG. 8). At this time, the divided exposure is performed on the photoresist film PR. FIG. 9 is a plan view showing a situation of the divided exposure processing in step S303 in FIG. 8. In FIG. 9, a boundary between a region to be exposed by the exposure processing and a region not to be exposed is indicated by a dashed line. The boundary indicated by the dashed line corresponds to a boundary between an active region and an element isolation region which are formed in a later process.

The divided exposure described here is an exposure in which the entire region to be a semiconductor chip is exposed by two-time exposure, that is, performing exposure processing once on each of a first region 1A and a second region 1B arranged in the surface of the semiconductor substrate SB instead of exposing the first region 1A and the second region 1B by one-time exposure processing. In the present embodiment, it is described that the entire region to be one semiconductor chip is divided into two exposure regions and the exposure is performed twice. However, the number of times of exposure performed to expose the entire region to be one semiconductor chip and the number of divided exposure regions may be three or more.

As shown in FIG. 9, the dividing line DL of the divided exposure on the photoresist film PR overlaps with at least a region where an active region of a specific pixel is formed in the semiconductor substrate SB in plan view. Specifically, the dividing line DL overlaps with an active region where the light receiving portion of each of a plurality of pixels belonging to one row among a plurality of pixels formed in a matrix form in a later process and linearly extends in the X axis direction in a region between two photodiodes formed in a later process in the active region. The region where the two photodiodes are formed means a region where an N⁻-type impurity region is formed in the upper surface of the semiconductor substrate SB in the active region, which is the light receiving portion.

As described above, in the present embodiment, the photoresist film PR is divided into two exposure regions, that is, the first region and the second region, and exposed. In other words, the exposure processing is individually performed on each of the first region and the second region. The mask pattern used at this time is individually prepared corresponding to each of the two exposure region. In other words, two types of mask patterns are used in the exposure processing in step S303 in FIG. 8.

Figure 10:
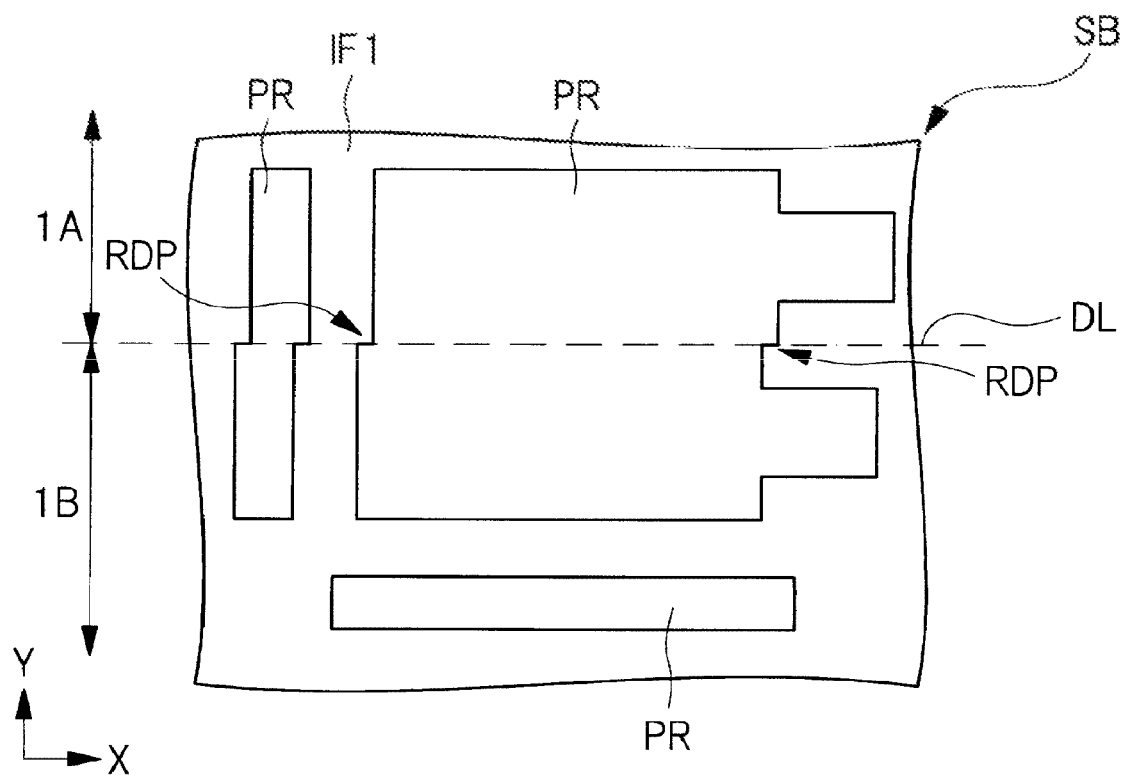
FIG. 10 is a plan view showing a manufacturing process of the semiconductor device following the process of FIG. 9.

Subsequently, as shown in FIG. 10, the photoresist film PR is patterned by developing the exposed photoresist film PR (step S304 in FIG. 8). FIG. 10 shows the patterned photoresist film PR. As shown in FIG. 10, the patterned photoresist film PR has a shape in which the resist pattern shifts along the dividing line DL regarded as a boundary in the X axis direction between the first region and the second region adjacent to each other in contact with the dividing line DL. This is because a position shift in the X axis direction occurs between the two types of mask patterns used in each exposure processing when the first region and the second region of the photoresist film PR are respectively exposed. As a result, a level difference RDP occurs in the side surface of the photoresist film along the dividing line DL regarded as a boundary. The position shift may occur not only in the X axis direction, but also in the Y axis direction between the two types of mask patterns.

Here, due to the above phenomenon, the upper surface of the protective film IF1 is exposed from the photoresist film PR in a region where the photoresist film PR is removed. The photoresist film PR covers a region where a plurality of active regions that form pixels will be formed. The region where the protective film IF1 is exposed is a region where the element isolation region is formed in a later process.

Figure 11:
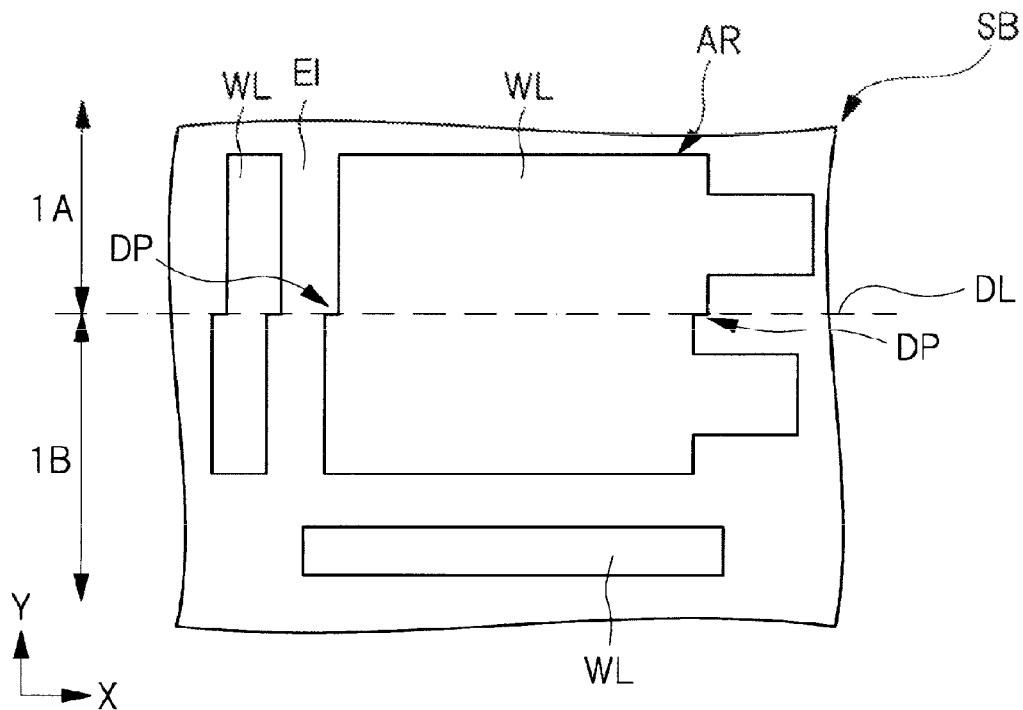
FIG. 11 is a plan view showing a manufacturing process of the semiconductor device following the process of FIG. 10.

Subsequently, as shown in FIG. 11, the protective film IF1 exposed from the photoresist film PR is removed by etching using the photoresist film PR as a mask (step S305 in FIG. 8). Thereafter, the photoresist film PR used as the mask for the etching is removed (step S306 in FIG. 8).

Subsequently, an oxidation is performed on the semiconductor substrate SB (step S307 in FIG. 8). At this time, in the upper surface of the semiconductor substrate SB, a portion where the protective film IF1 is formed is not oxidized and only a portion exposed from the protective film IF1 is oxidized. Thereby, the element isolation region EI that partitions a plurality of active regions including the active region AR over the semiconductor substrate SB is formed. Thereafter, the protective film IF1 is removed while leaving the element isolation region EI (step S308 in FIG. 8). Thereby, the main surface of the semiconductor substrate SB of the active region, which was covered by the protective film IF1, is exposed.

FIG. 11 shows a structure obtained by performing step S308 in FIG. 8 and is a plan view showing a region to be one pixel. The region to be one pixel has the active region AR to be a light receiving portion and two active regions formed around the active region AR. The active region AR is a region, inside of which two photodiodes are formed in a later process. Among a plurality of pixels arranged over the semiconductor substrate SB, in the active region AR of a plurality of pixels in a row overlapping with the dividing line DL, the level difference DP is formed on the periphery in plan view according to the level difference RDP formed in the side surface of the photoresist film PR (see FIG. 10).

Figure 12:
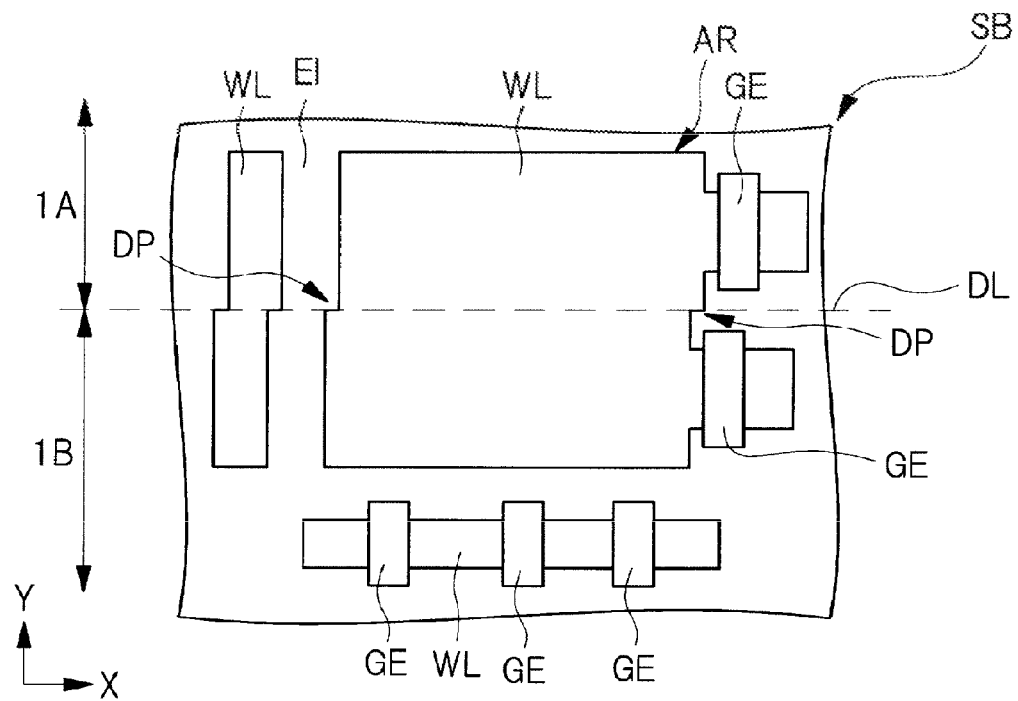
FIG. 12 is a plan view showing a manufacturing process of the semiconductor device following the process of FIG. 11.

Subsequently, as shown in FIG. 12, the gate electrode GE is formed over each active region that forms various MOS transistors such as a transfer transistor, a reset transistor, an amplifier transistor, and a selection transistor, through a gate insulating film (not shown in the drawings) (step S4 in FIG. 7). Specifically, an insulating film and a polysilicon film are laminated over the semiconductor substrate SB by a CVD (Chemical Vapor Deposition) method or the like and thereafter the gate insulating film formed of the insulating film and the gate electrode GE formed of the polysilicon film are formed by patterning the polysilicon film and the insulating film by etching using a photolithography technique.

A plurality of formed gate electrodes GE and the gate insulating films below the gate electrodes GE have a rectangular pattern extending in the Y axis direction in plan view and are formed over predetermined active regions. The gate electrode GE of the transfer transistor formed adjacent to the active region AR is formed immediately above a semiconductor region protruding from the active region AR in the X axis direction. In the present embodiment, two photodiodes are formed and two transfer transistors are formed corresponding to the photodiodes, so that two protrusion portions and two gate electrodes GE are formed. The two transfer transistors in one pixel may share one gate electrode GE.

The reset transistor, the amplifier transistor, and the selection transistor, which are the peripheral transistors, are formed side by side in another active region adjacent to the active region AR, which is the light receiving portion, in a region to be one pixel. Therefore, three gate electrodes GE of these peripheral transistors are formed so as to straddle over the other active region. The three gate electrodes GE are arranged side by side in the X axis direction immediately above the other active region extending in the X axis direction.

In a process for forming the gate electrodes GE, when patterning the polysilicon film and the insulating film as described above, the divided exposure processing is performed in the same manner as the process described with reference to FIGS. 8 to 10. The boundary, on each side of which the exposure processing is separately performed, is defined at the same position as that in the formation process of the active region AR. In other words, each of a first region 1A and a second region 1B is exposed in a different process by using a different mask on each side of the dividing line DL that overlaps with the active region AR. Therefore, a shift occurs along the dividing line DL between a formation position of the gate electrode GE formed in the first region and a formation position of the gate electrode GE formed in the second region.

Here, the gate electrode GE of the transfer transistor formed in a later process does not overlap with the dividing line DL in plan view. This is because to prevent an isolated gate pattern from being formed due to a shift generated by the divided exposure in a gate pattern formed over the first region 1A and the second region 1B which are respectively formed on both sides of the dividing line DL.

Figure 13:
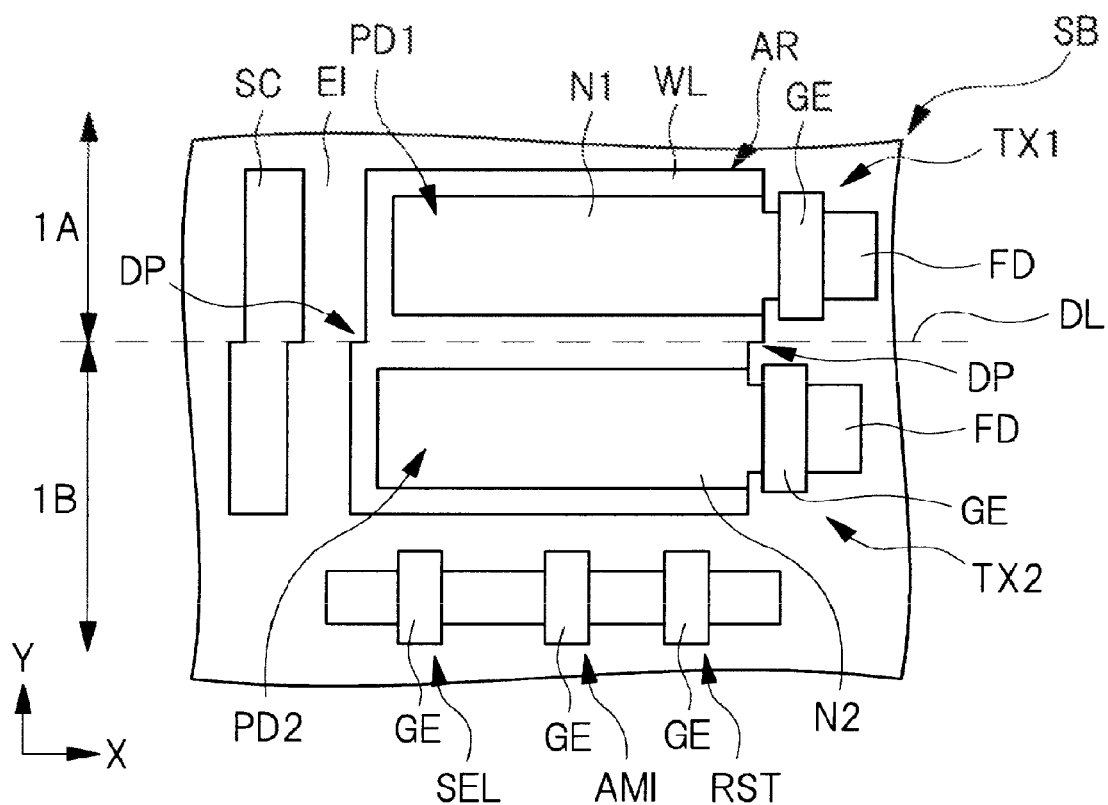
FIG. 13 is a plan view showing a manufacturing process of the semiconductor device following the process of FIG. 12.

Subsequently, as shown in FIG. 13, various ion implantation processes are performed. Thereby, the N⁻-type semiconductor regions N1 and N2 are formed in the upper surface of the well region WL in the active region AR, the drain region of the transfer transistor is formed, and the source/drain regions of each peripheral transistor are formed in another active region (step S5 in FIG. 7). The N⁻-type semiconductor regions N1 and N2 are formed by implanting and introducing N-type impurities (for example, P (phosphorus) or As (arsenic)) into the main surface of the semiconductor substrate SB.

By the ion implantation described above, in the active region AR, the photodiode PD1 formed of the N⁻-type semiconductor region N1 and the well region WL and the photodiode PD2 formed of the N⁻-type semiconductor region N2 and the well region WL are formed. Further, in the active region AR, the transfer transistors TX1 and TX2, each of which includes the gate electrode GE and the source/drain regions on both sides of the gate electrode GE, are formed by the ion implantation described above. Further, in another active region, the reset transistor RST, the amplifier transistor AMI, and the selection transistor SEL, each of which includes the gate electrode GE and the source/drain regions on both sides of the gate electrode GE, are formed by the ion implantation described above.

At this time, the photodiode PD1 is formed in the first region 1A and does not overlap with the dividing line DL in plan view. In the same manner, the photodiode PD2 is formed in the second region 1B and does not overlap with the dividing line DL in plan view. The transfer transistor TX1 is formed adjacent to the photodiode PD1 in the active region AR in the first region 1A and the transfer transistor TX2 is formed adjacent to the photodiode PD2 in the active region AR in the second region 1B.

In the process for forming various semiconductor regions described above, the ion implantation is performed by using a photoresist film (not shown in the drawings) as a mask. When forming a pattern of the photoresist mask, the divided exposure processing is performed in the same manner as in the process described with reference to FIGS. 8 to 10. The boundary, on each side of which the exposure processing is separately performed, is defined at the same position as that in the formation process of the active region AR. In other words, each of the first region 1A and the second region 1B is exposed in a different process by using a different mask on each side of the dividing line DL that overlaps with the active region AR. Therefore, for example, a shift occurs along the dividing line DL between a formation position of the N⁻-type semiconductor region N1 formed in the first region and a formation position of the N⁻-type semiconductor region N2 formed in the second region. From the above, the structure shown in FIG. 13 is obtained.

Subsequently, the interlayer insulating film IF, the contact plug CP, and the wirings M1 to M3 (see FIGS. 4 and 6) are formed over the semiconductor substrate SB, so that the solid state image sensor which is the semiconductor device of the present embodiment is completed. Specifically, a first layer of the interlayer insulating film is formed over the semiconductor substrate SB (step S6 in FIG. 7), and thereafter, a plurality of contact plugs CP penetrating the insulating film are formed. Subsequently, a lower layer wiring M1 coupled to the contact plug CP is formed over the first layer of the interlayer insulating film (step S8 in FIG. 7).

Thereafter, a second layer of the interlayer insulating film is formed over the first layer of the interlayer insulating film, and then, a via plug penetrating the second layer of the interlayer insulating film and the wiring M2 over the via plug are formed. Further, by the same process, a third layer of the interlayer insulating film, a via plug, the wiring M3, and a fourth layer of the interlayer insulating film are formed over the wiring M2, so that the wiring of the upper layer is formed (step S9 in FIG. 7). The laminated film including the first to the fourth layers of the interlayer insulating film forms the interlayer insulating film IF.

A plurality of pixels PE2 shown in FIGS. 3 to 6 are formed in a region overlapping with the dividing line DL and a plurality of pixels PE1 shown in FIG. 5 are formed in a region that does not overlap with the dividing line DL. By the processes described above, the solid state image sensor which is the semiconductor device of the present embodiment shown in FIGS. 3 to 6 is completed.

As shown in FIG. 6, it is possible to form the color filter CF and the microlens ML in order over the interlayer insulating film IF.

In the process for forming the interlayer insulating film IF, the contact plug CP, the via plug, and the wirings M1 to M3, a patterning by etching using a photoresist film (not shown in the drawings) as a mask is performed. When forming a pattern of the photoresist mask, the divided exposure processing is performed in the same manner as in the process described with reference to FIGS. 8 to 10. The boundary, on each side of which the exposure processing is separately performed, is defined at the same position as that in the formation process of the active region AR shown in FIG. 11. In other words, each of the first region 1A and the second region 1B is exposed in a different process by using a different mask on each side of the dividing line DL that overlaps with the active region AR.

When the wiring layer over the semiconductor substrate SB shown in FIG. 6 is formed by the divided exposure, in order to reduce the amount of shift between the active region AR in the main surface of the semiconductor substrate SB and the wiring layer, the dividing line of the divided exposure in the formation process of the wiring layer is defined at the same position as that of the dividing line DL (see FIG. 13) in the formation process of the active region AR. Therefore, a pattern including the wiring layer such as, for example, the pattern of the wirings M1 to M3, has a shape in which a shift occurs at a position overlapping with the dividing line DL in plan view.

Hereinafter, problems when setting the dividing region of the exposure processing between pixels in the manufacturing process of the semiconductor device of the present embodiment, and the features and effects of the semiconductor device of the present embodiment will be described.

When performing the divided exposure in the manufacturing process of the solid state image sensor, it can be considered to set the position at which the exposure region is divided, that is, the boundary between the first region and the second region described above, to a position overlapping with the element isolation region between a plurality of pixels formed in the solid state image sensor.

However, when the dividing line of the divided exposure is located in a region overlapping with only the region where the element isolation region is formed, the size of the element isolation region formed in the region overlapping with the dividing line becomes small due to a position shift between two types of masks respectively used when exposing two exposure regions sandwiching the dividing line. Further, it can be considered that a dimensional controllability of a pattern formed at an edge portion of an exposure mask (mask edge) is degraded when the pattern is transferred to the photoresist film.

By these reasons, when defining the dividing line between pixels, the electrical insulation between elements by the element isolation region is not sufficiently ensured, so that there is a risk to cause performance degradation or malfunction of the solid state image sensor. The main reason why the leakage between pixels easily occurs in this way is because a potential difference between pixels adjacent to each other is large during an operation such as imaging.

Further, it can be considered to secure a margin against the position shift by setting in advance a large width of the element isolation region between pixels. However, in this case, the area of the light receiving portion decreases, so that there is a problem that the quality of images obtained by the imaging is degraded, and the like. Further, in the element isolation region in the pixel array portion, when the width of only an element isolation region, with which the dividing line overlaps, is increased, the arrangement of a plurality of pixels arranged in a matrix form becomes uneven, so that it is difficult to obtain an accurate image by the solid state image sensor.

On the other hand, in the manufacturing method of the semiconductor device of the present embodiment, as described with reference to FIGS. 8 to 11, the boundary between the first region and the second region where the divided exposure is performed is defined to overlap with an region between regions where the first diode and the second diode are formed respectively in a pixel. Therefore, the photodiodes PD1 and PD2 are respectively formed on both sides of the dividing line DL in the active region AR and do not overlap with the dividing line DL.

When the solid state image sensor is formed by determining the position of the dividing line and then performing the divided exposure in this way, as shown in FIG. 13, each of two sides in parallel with each other on the periphery of the active region AR, which is the light receiving portion of the pixel PE2, has a shape somewhat shifting in a specific direction at a position, where each of the sides overlaps with the dividing line DL. Therefore, the level difference DP occurs in each of the two sides.

As compared with a case in which the dividing line is defined between pixels adjacent to each other, it is possible to prevent the insulation between elements from degrading due to a variation of the size of the element isolation region EI between pixels by defining the dividing line DL of the divided exposure at a region overlapping with the pixel PE2 as in the present embodiment. Further, it is not necessary to secure a large margin of the size by considering the variation of the size of the element isolation region EI between pixels, so that it is possible to improve the performance of the solid state image sensor by reducing the size of the element isolation region EI and increasing the area of the pixel. Further, it is not necessary to increase a margin of the size of only the element isolation region EI that overlaps with the dividing line by considering the variation of the size of the element isolation region EI between pixels, so that it is possible to prevent the variation of the size of the element isolation region EI in a pixel array region.

In the present embodiment, it can be considered that a position shift of a pattern occurs along the dividing line DL and the distance between the photodiodes PD1 and PD2 decreases. However, when the solid state image sensor is operated, a potential difference between the photodiodes PD1 and PD2 in the pixel PE2 is smaller than a potential difference between pixels adjacent to each other. Therefore, it is possible to reduce the width of the element isolation region EI between pixels while preventing leakage between pixels, so that it is easy to densely arrange pixels in the solid state image sensor.

Even when leakage occurs between the photodiodes PD1 and PD2 in the pixel PE2, the photodiodes PD1 and PD2 operate as one photodiode, so that there is no change in an image obtained by the image sensor as compared with a case in which the leakage does not occur. Therefore, in the semiconductor device of the present embodiment, it is possible to prevent the imaging performance of the solid state image sensor from degrading as compared with a case in which the dividing line is defined between pixels as described above.

Further, the level difference DP formed by the manufacturing method of the present embodiment can be visually observed easily by the SEM observation or the like, so that it is easy to manage the amount of relative shift between patterns formed in each of divided exposure regions. Thereby, it is possible to suppress a position shift of an impurity implantation region or a shift of formation position of the gate electrode GE and the like with respect to the active region which is formed by the divided exposure and whose position is shifted. Therefore, it is possible to improve the performance of the solid state image sensor.

From the above, in the present embodiment, it is possible to improve the imaging performance and the automatic focus detection performance of the solid state image sensor, so that it is possible to improve the performance of the semiconductor device.

(Second Embodiment)

In the present embodiment, it is described that the distance between the photodiodes arranged in a pixel is increased by shifting formation positions of the photodiodes in the pixel with which the dividing line of the divided exposure overlaps.

Figure 14:
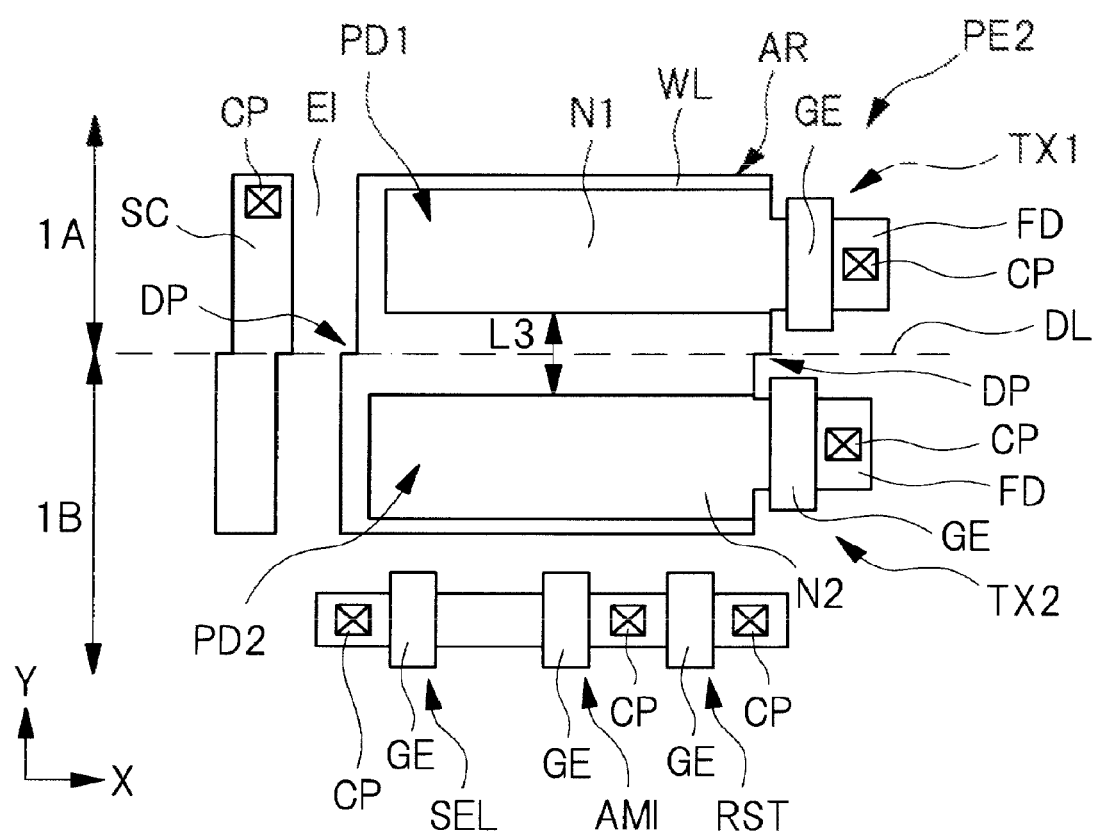
FIG. 14 is a plan layout showing a semiconductor device which is a second embodiment of the present invention.

FIG. 14 shows a plan layout of the semiconductor device of the present embodiment. In the same manner as FIG. 4, FIG. 14 shows the pixel PE2 overlapping with the dividing line DL in plan view from among a plurality of pixels arranged in the pixel array portion of the solid state image sensor. The configuration of the solid state image sensor of the present embodiment is substantially the same as that of the solid state image sensor of the first embodiment. However, as shown in FIG. 14, it is different from the first embodiment in that the distance between the photodiodes PD1 and PD2 in the pixel PE2 is large.

Specifically, as compared with the first embodiment, the formation positions of the photodiodes PD1 and PD2 in the active region AR are shifted in a direction in which each of the photodiodes PD1 and PD2 goes away from the dividing line DL, and each of the photodiodes PD1 and PD2 is arranged close to the boundary between the active region AR and the element isolation region EI. Therefore, in the Y axis direction in which the photodiodes PD1 and PD2 line up in the active region AR, the width of the intermediate region between the photodiode PD1 and the photodiode PD2 is greater than the width in the Y axis direction of the intermediate region in the first embodiment shown in FIG. 4.

A point where the present embodiment is very different from the first embodiment is that the width of the intermediate region in the Y axis direction in the pixel PE2 that overlaps with the dividing line is greater than that in the pixel PE1 (see FIG. 5) that does not overlap with the dividing line. In other words, the distance L3 between the photodiode PD1 and the photodiode PD2 in the pixel PE2 shown in FIG. 14 is greater than the distance L2 between the photodiode PD1 and the photodiode PD2 in the pixel PE1 shown in FIG. 5. The reason why the width of the intermediate region of only the pixel PE2 overlapping with the dividing line DL is increased in this manner is because to prevent the photodiodes PD1 and PD2 in the pixel PE2 from being close to each other due to a position shift of the exposure mask in the manufacturing process of the solid state image sensor or a pattern transfer accuracy of the mask edge.

In other words, there is a risk that the photodiodes provided so as to sandwich the boundary of the divided exposure are close to each other due to an overlay (overlap) shift of an exposure mask, so that a leakage occurs between the photodiodes, and further there is a risk that the photodiodes are in contact with each other and coupled together, so that they do not function as two diodes. Further, there is a risk that the area of the N⁻-type semiconductor region N1 that forms each photodiode in a pixel greatly varies due to multiple exposures. When some portions of two photodiodes overlap with each other by the above phenomenon, the area of the light receiving portion in the pixel decreases. In these cases, when the pixel is operated for the automatic focusing of the solid state image sensor, the pixel does not operate normally, so that an error of image plane phase difference information occurs and there is a problem that the performance of the semiconductor device degrades.

On the other hand, in the present embodiment, a large margin is set between the photodiodes PD1 and PD2 by increasing the distance L3, which is the distance between the N⁻-type semiconductor region N1 and the N⁻-type semiconductor region N2, in each of a plurality of pixels PE2 lining up in a row overlapping with the dividing line DL. Thereby, it is possible to prevent the photodiodes PD1 and PD2 near the dividing line DL of the divided exposure from being in contact with each other and from being close to each other, and further it is possible to prevent the area of each photodiode PD1 and PD2 from greatly varying due to multiple exposures. Therefore, it is possible to suppress increase in the error of the image plane phase difference information, so that it is possible to improve the performance of the semiconductor device.

The area of the photodiodes PD1 and PD2 in each pixel PE2 is the same as that of the photodiodes PD1 and PD2 in the pixel PE1 (see FIG. 5) that does not overlap with the dividing line DL and is the same as that of the photodiodes PD1 and PD2 in the first embodiment shown in FIG. 4. In other words, in the manufacturing process of the solid state image sensor of the present embodiment, the area where impurities are implanted to form each of the N⁻-type semiconductor regions N1 and N2 in the pixel PE2 is the same as the area of the N⁻-type semiconductor regions N1 and N2 in the pixel PE1 (see FIG. 5) that does not overlap with the dividing line DL and is the same as the area of the N⁻-type semiconductor regions N1 and N2 in the first embodiment shown in FIG. 4. Therefore, it is possible to keep the light receiving area of each pixel constant, so that it is possible to prevent the image quality performance of the solid state image sensor from degrading due to a variation of the light receiving area.

Further, the area of the pixel PE2 and the area of the active area AR in the pixel PE2 do not increase, so that the pitch of the arrangement of a plurality of pixels PE1 and PE2 (see FIG. 3) arranged in the pixel array portion is constant. In other words, in a predetermined direction, a distance between any pixels adjacent to each other is constant. Therefore, the length of the active region AR in the Y axis direction is the same in any of the pixels PE1 and PE2. Therefore, it is possible to prevent the performance of the automatic focusing using the solid state image sensor and the image quality performance of images obtained by the imaging from degrading due to the variation of the performance of the pixels.

The semiconductor device of the present embodiment achieves the same effects as those of the first embodiment by defining the boundary of the divided exposure between the photodiodes in a pixel.

The semiconductor device of the present embodiment can be formed by the same manufacturing method as that of the semiconductor device of the first embodiment. In the solid state image sensor manufactured in this way, it is possible to obtain an effect to prevent the performance of the semiconductor device from degrading due to a shift in the positioning of a mask or the like by increasing the distance between the photodiodes as described above, and further it is possible to obtain the same effects as those of the embodiment described above.

In order to prevent the performance of the transfer transistors TX1 and TX2 from degrading, the distance between each edge portion of the photodiodes PD1 and PD2 facing the dividing line DL and the dividing line DL is set to be smaller than or equal to the distance between an edge portion of the drain region, which faces the dividing line DL, of the transfer transistor TX1 or the transfer transistor TX2 adjacent to the photodiode PD1 or PD2 and the dividing line DL. In other words, the distance between each of the photodiodes PD1 and PD2 and the dividing line DL is smaller than or equal to the distance between the protrusion portion in plan view of the active region AR and the dividing line DL.

Figure 15:
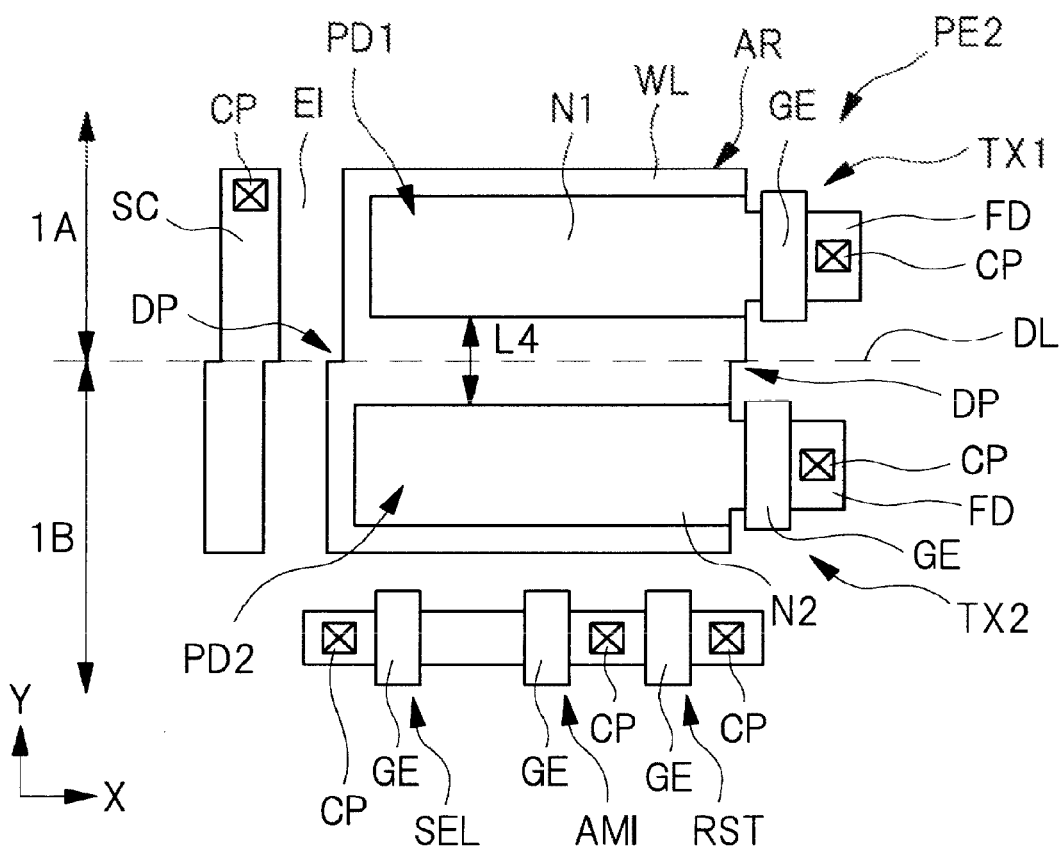
FIG. 15 is a plan layout showing a semiconductor device which is a modified example of the second embodiment of the present invention.

Next, a modified example of the semiconductor device of the present embodiment will be described with reference to FIG. 15. FIG. 15 is a plan layout showing the semiconductor device which is the modified example of the present embodiment.

The pixel PE2 shown in FIG. 15 has substantially the same configuration as that of the pixel PE2 shown in FIG. 14. However, the pixel PE2 shown in FIG. 15 is different from the pixel PE2 shown in FIG. 14 in that the length of the active region AR in the Y axis direction is large. In other words, the length of the active region AR in the Y axis direction of the pixel PE2 is greater than that of the pixel PE1 (see FIG. 5). In the semiconductor device of the modified example of the present embodiment shown in FIG. 15, in the same manner as in the semiconductor device shown in FIG. 14, it is possible to suppress the increase in the error of the image plane phase difference information by increasing the distance between the photodiodes PD1 and PD2 in the pixel PE2 overlapping with the dividing line DL, so that it is possible to improve the performance of the semiconductor device.

In other words, the distance L4 between the photodiode PD1 and the photodiode PD2 in the pixel PE2 shown in FIG. 15 is greater than the distance L2 between the photodiode PD1 and the photodiode PD2 in the pixel PE1 shown in FIG. 5.

Here, when the solid state image sensor is operated, a potential difference between each of the peripheral transistors including the amplifier transistor AMI and the like and the photodiode PD2 of the active region AR is large, so that when the peripheral transistors formed along a side of edge portion of the active region AR and the photodiode PD2 are close to each other, there is a risk that leakage occurs between the photodiode PD2 and the peripheral transistors. In this case, there is a problem that the solid state image sensor does not operate normally. Further, when the photodiode PD1 in the pixel PE2 and the peripheral transistors in another pixel PE1 are close to each other, there is a risk that leakage occurs. In this case, there is a problem that the solid state image sensor does not operate normally. When leakage occurs between the light receiving portion and the peripheral transistors, noise occurs in a signal outputted from the pixel, so that there is a risk that the performance of the semiconductor device degrades.

This problem is significant when the area of the light receiving portion in each pixel is increased and the size of the element isolation region between the light receiving portion in a pixel and peripheral pixels is reduced or the width of the element isolation region between pixels is reduced in order to increase the density of pixels in the pixel array portion.

In the present modified example, different from the configuration shown in FIG. 14, the width of the active region AR in the Y axis direction is increased, and accordingly the photodiodes PD1 and PD2 are arranged away from the dividing line DL. Therefore, the distance between an edge portion of the active region AR and the photodiode PD1 or PD2 adjacent to the edge portion in the Y axis direction is the same in any of the pixels PE1 and PE2 (see FIGS. 4 and 5). In other words, here, the distance between each of the photodiodes PD1 and PD2 and the dividing line DL is increased without reducing the distance between each of the photodiodes PD1 and PD2 and the peripheral transistors.

Thereby, it is possible to prevent the photodiode PD2 and the peripheral transistors from being close to each other in the pixel PE2 and to prevent a leakage current from flowing. Further, it is possible to prevent the photodiode PD1 in the pixel PE2 and the peripheral transistors in another pixel PE1 from being close to each other, so that it is possible to prevent leakage from occurring. Therefore, it is possible to prevent the performance of pixels from degrading due to generation of noise and the like caused by a leakage current between elements.

(Third Embodiment)

In the present embodiment, it is described that the distance between the photodiodes arranged in a pixel is increased and the area of the photodiodes is reduced.

Figure 16:
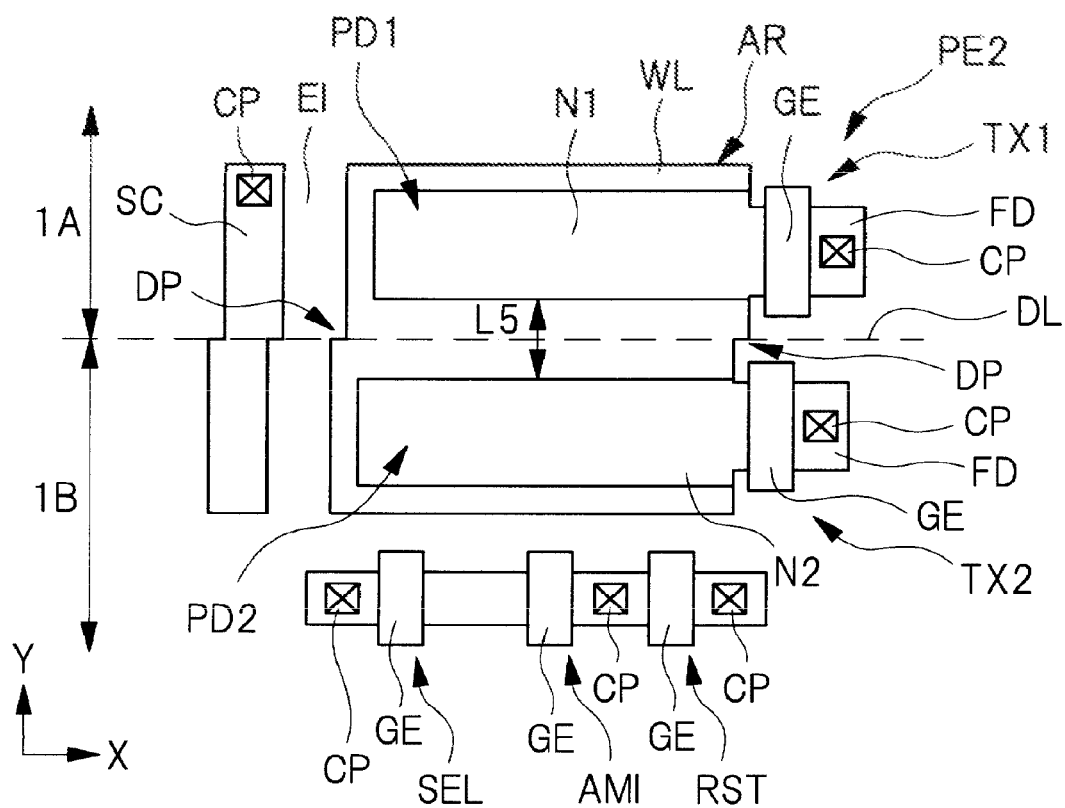
FIG. 16 is a plan layout showing a semiconductor device which is a third embodiment of the present invention.

FIG. 16 is a plan layout of the semiconductor device of the present embodiment. In the same manner as FIG. 4, FIG. 16 shows the pixel PE2 overlapping with the dividing line DL in plan view from among a plurality of pixels arranged in the pixel array portion of the solid state image sensor. The configuration of the solid state image sensor of the present embodiment is substantially the same as that of the second embodiment, including that the distance between the photodiodes PD1 and PD2 in the pixel PE2 is large. However, as shown in FIG. 16, it is different from the second embodiment in that the area of each of the photodiodes PD1 and PD2 in the pixel PE2 is small.

Specifically, while the second embodiment ensures a margin of the intermediate region overlapping with the dividing line DL of the divided exposure by shifting the formation positions of the photodiodes PD1 and PD2 in the pixel PE2 of the first embodiment, the present embodiment ensures a margin of the intermediate region by causing an edge portion of each photodiode PD1 and PD2 facing the dividing line DL in the pixel PE2 to be away from the dividing line DL.

Therefore, the distance L5 between the photodiode PD1 and the photodiode PD2 in the pixel PE2 shown in FIG. 16 is greater than the distance L2 between the photodiode PD1 and the photodiode PD2 in the pixel PE1 shown in FIG. 5. Further, in the present embodiment, the size of each of the photodiodes PD1 and PD2 in the Y axis direction is smaller than that of the photodiodes PD1 and PD2 in the pixel PE1 (see FIG. 5) that does not overlap with the dividing line DL. In other words, the area of each of the photodiodes PD1 and PD2 in the pixel PE2 is smaller than that of the photodiodes PD1 and PD2 in the pixel PE1 (see FIG. 5) that does not overlap with the dividing line DL.

In other words, the distance between each of the photodiodes PD1 and PD2 in the pixel PE2 and the dividing line DL is greater than the distance between each of the photodiodes PD1 and PD2 in the pixel PE1 and the dividing line DL. Further, the distance between edge portions of the photodiodes PD1 and PD2, which are farthest from the dividing line DL, in the pixel PE2 is the same as the distance between edge portions of the photodiodes PD1 and PD2, which are farthest from the dividing line DL, in the pixel PE1. Further, the distance between one side of the active region AR extending in the X axis direction and the photodiode PD1 or PD2 which is closer to the one side than the other photodiode PD1 or PD2 in the active region AR is the same in any of the pixels PE1 and PE2.

In other words, in the Y axis direction in which the photodiodes PD1 and PD2 line up, which are formed in the pixel PE2 overlapping with the dividing line DL, the length of each of the photodiodes PD1 and PD2 is smaller than the length in the Y axis direction of each of the photodiodes PD1 and PD2 formed in the pixel PE1 that does not overlap with the dividing line DL.

The distance between the photodiodes PD1 and PD2 in the pixel PE2 overlapping with the dividing line DL is increased in this way, so that, in the same manner as in the second embodiment, it is possible to prevent the photodiodes PD1 and PD2 near the dividing line DL of the divided exposure from being in contact with each other and from being close to each other, and further it is possible to prevent the area of each photodiode PD1 and PD2 from greatly varying due to multiple exposures. Therefore, it is possible to suppress the increase in the error of the image plane phase difference information, so that it is possible to improve the performance of the semiconductor device.

Further, the area of the active area AR does not increase, so that the pitch of the arrangement of a plurality of pixels PE1 and PE2 (see FIG. 3) arranged in the pixel array portion is constant. In other words, in a predetermined direction, a distance between any pixels adjacent to each other is constant. Therefore, the length of the active region AR in the Y axis direction is the same in any of the pixels PE1 and PE2. Therefore, it is possible to prevent the performance of the automatic focusing using the solid state image sensor and the image quality performance of images obtained by the imaging from varying.

Here, when the solid state image sensor is operated, a potential difference between each of the peripheral transistors including the amplifier transistor AMI and the like and the photodiode PD2 of the active region AR is large, so that when the peripheral transistors formed along a side of edge portion of the active region AR and the photodiode PD2 are close to each other, there is a risk that leakage occurs between the photodiode PD2 and the peripheral transistors. In this case, there is a problem that the solid state image sensor does not operate normally. Further, when the photodiode PD1 in the pixel PE2 and the peripheral transistors in another pixel PE1 are close to each other, there is a risk that leakage occurs. In this case, there is a problem that the solid state image sensor does not operate normally. When leakage occurs between the light receiving portion and the peripheral transistors, noise occurs in a signal outputted from the pixel, so that there is a risk that the performance of the semiconductor device degrades.

On the other hand, in the present embodiment, the distance between the photodiode PD2 and the peripheral transistors in the pixel PE2 is the same as that in the pixel PE1 (see FIG. 5), so that it is possible to prevent the photodiode PD2 and the peripheral transistors from being close to each other in the pixel PE2 and to prevent a leakage current from flowing. Further, it is possible to prevent the photodiode PD1 in the pixel PE2 and the peripheral transistors in another pixel PE1 from being close to each other, so that it is possible to prevent leakage from occurring.

Even when the dividing line DL of the divided exposure is defined to overlap with the active region AR which is the light receiving portion, the photodiodes PD1 and PD2 are arranged to be away from the dividing line DL and the distance between the peripheral transistors and the photodiode PD2 is not changed, so that it is possible to prevent the photodiodes PD1 and PD 2 and the peripheral transistors from being electrically coupled to each other. Therefore, it is possible to prevent the performance of pixels from degrading due to generation of noise and the like caused by a leakage current between elements. Therefore, it is possible to prevent the performance of pixels near the dividing line DL and the performance of the other pixels from varying.

The semiconductor device of the present embodiment can be formed by the same manufacturing method as that of the semiconductor device of the first embodiment. Here, the area where impurities are implanted to form the N$^-$-type semiconductor regions N1 and N2 that form the photodiodes PD1 and PD2 in the active region AR overlapping with the dividing line DL is set to be smaller than the area where impurities are implanted to form the N$^-$-type semiconductor regions N1 and N2 that form the photodiodes PD1 and PD2 in the active region AR in the pixel PE1 that does not overlap with the dividing line DL. Further, the distance between an area where impurities are implanted to form the N$^-$-type semiconductor region N1 and an area where impurities are implanted to form the N$^-$-type semiconductor region N2 in the active region AR in the pixel PE2 is set to be greater than that in the pixel PE1.

In the solid state image sensor manufactured in this way, it is possible to obtain an effect to prevent the performance of the semiconductor device from degrading due to a shift in the positioning of a mask or the like by increasing the distance between the two photodiodes facing each other with the boundary of the divided exposure in between, and further, it is possible to prevent the performance of pixels from degrading due a leakage current between elements by causing the photodiode PD2 and the peripheral transistors not to be close to each other.

In order to prevent the performance of the transfer transistors TX1 and TX2 from degrading, the distance between each edge portion of the photodiodes PD1 and PD2 facing the dividing line DL and the dividing line DL is set to be smaller than or equal to the distance between an edge portion of the drain region, which faces the dividing line DL, of the transfer transistor TX1 or the transfer transistor TX2 adjacent to the photodiode PD1 or PD2 and the dividing line DL. In other words, the distance between each of the photodiodes PD1 and PD2 and the dividing line DL is smaller than or equal to the distance between the protrusion portion in plan view of the active region AR and the dividing line DL.

Figure 17:
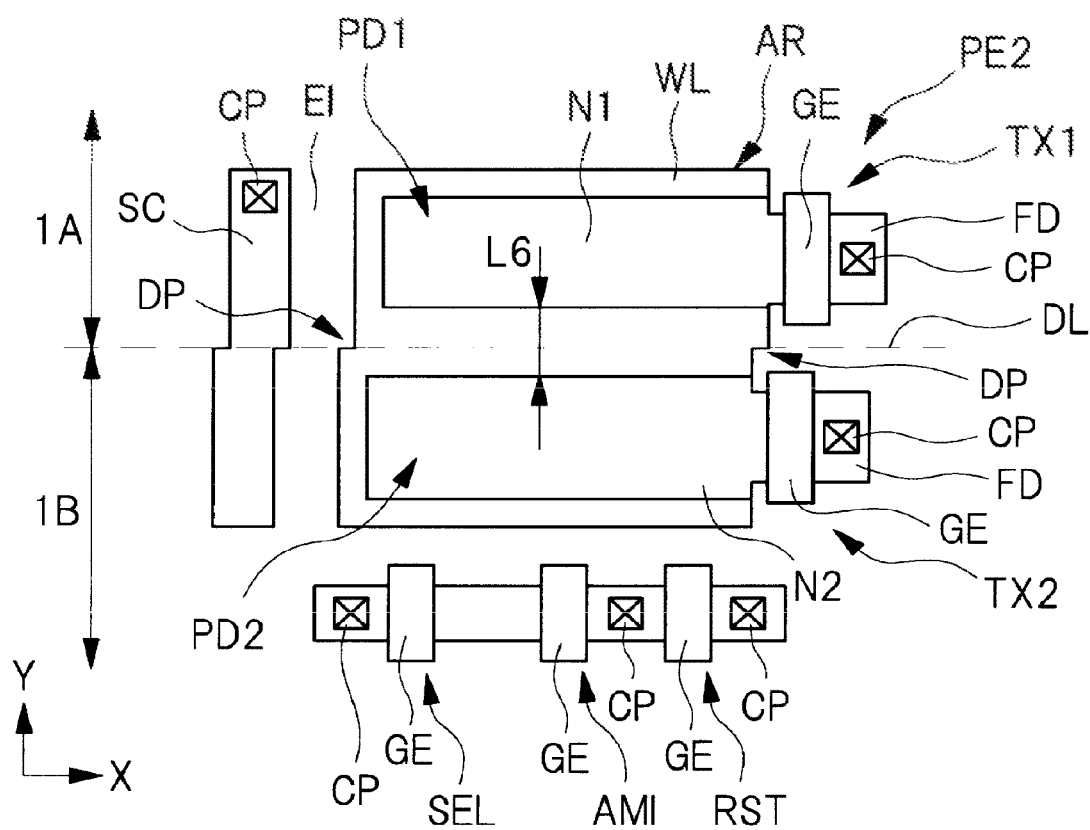
FIG. 17 is a plan layout showing a semiconductor device which is a modified example of the third embodiment of the present invention.

Next, a modified example of the semiconductor device of the present embodiment will be described with reference to FIG. 17. FIG. 17 is a plan layout showing the semiconductor device which is the modified example of the present embodiment.

The pixel PE2 shown in FIG. 17 is different from the pixel PE2 shown in FIG. 16 in that the width of the photodiode PD2 in the Y axis direction is greater than the width of the photodiode PD1 in the Y axis direction. Specifically, here, the size of the intermediate region overlapping with the dividing line is increased by distancing only the edge portion of the photodiode PD1 in the pixel PE2 overlapping with the dividing line DL from the dividing line DL. Thereby, it is possible to suppress the increase in the error of the image plane phase difference information, so that it is possible to improve the performance of the semiconductor device.

In the present modified example, the distance between the photodiodes PD1 and PD2 in the pixel PE2 is increased and the photodiodes PD1 and PD2 are prevented from being close to the peripheral transistors, so that it is possible to obtain the same effects as those of the solid state image sensor shown in FIG. 16. Therefore, the distance L6 between the photodiode PD1 and the photodiode PD2 in the pixel PE2 shown in FIG. 17 is greater than the distance L2 between the photodiode PD1 and the photodiode PD2 in the pixel PE1 shown in FIG. 5.

In addition to this, the present modified example has a feature that the area of the photodiode PD2 in the pixel PE2 is the same as the area of each of the photodiodes PD1 and PD2 in the pixel PE1 (see FIG. 5) that does not overlap the dividing line DL.

In the pixel PE2, the distance between the photodiode PD1 and the dividing line DL is greater than the distance between the photodiode PD2 and the dividing line DL. In other words, in the pixel PE2, the photodiode PD2 is arranged closer to the dividing line DL than the photodiode PD1. Specifically, in the Y axis direction in which the photodiodes PD1 and PD2 line up in the pixel PE2, the width of the photodiode PD1 in the pixel PE2 is smaller than the width of the photodiode PD2 in the pixel PE2, the width of the photodiode PD1 in the pixel PE1, and the width of the photodiode PD2 in the pixel PE1.

Thereby, it is possible to equalize the area of the photodiode PD2 in the pixel PE2 to the size of the photodiodes PD1 and PD2 in another pixel PE1. Therefore, it is possible to suppress the increase in the error of the image plane phase difference information between elements, so that it is possible to improve the quality of images obtained by the solid state image sensor. Therefore, it is possible to improve the performance of the semiconductor device.

(Fourth Embodiment)

In the present embodiment, a configuration in which the dividing line of the divided exposure overlaps with a photodiode in a pixel in plan view will be described with reference to FIG. 18. FIG. 18 is a plan layout of the semiconductor device of the present embodiment.

In the same manner as FIG. 4, FIG. 18 shows the pixel PE2 overlapping with the dividing line DL in plan view from among a plurality of pixels arranged in the pixel array portion of the solid state image sensor. The configuration of the solid state image sensor of the present embodiment is substantially the same as that of the first embodiment. However, as shown in FIG. 18, it is different from the first embodiment in that the dividing line DL of the divided exposure overlaps with the photodiode PD1 in the pixel PE2 in plan view.

The dividing line DL extends in the longitudinal direction of the photodiodes PD1 and PD2, that is, the X axis direction. Specifically, here, in the pixel PE2, the photodiodes PD1 and PD2 are arranged to line up in the Y axis direction and the dividing line DL extends in the X axis direction perpendicular to the Y axis direction. Therefore, the dividing line DL overlapping with the photodiode PD1 in plan view does not overlap with the intermediate region between the photodiodes PD1 and PD2 in the pixel PE2 and the photodiode PD2.

Therefore, the level difference DP occurs on the periphery of the active region AR in a region adjacent to the photodiode PD1 in the X axis direction. Here, the level difference DP occurs in the active region AR at a position overlapping with the dividing line DL. Further, a level difference WD occurs on the boundary between the N$^-$-type semiconductor region N1 and the well region WL at a position overlapping with the dividing line DL in plan view. This is because, in the manufacturing process of the semiconductor device of the present embodiment, the N$^-$-type semiconductor region N1 is formed by implanting impurities by using a resist pattern formed by exposure processing divided at the dividing line DL as a mask (step S5 in FIG. 7). Therefore, as shown in FIG. 18, the N$^-$-type semiconductor region N1 formed at a position overlapping with the dividing line DL has a shape in which the formation positions of the first region 1A and the second region 1B are shifted from each other due to a position shift of the mask and the like.

However, the dividing line DL does not overlap with the drain region of the transfer transistor TX1 adjacent to the photodiode PD1 overlapping with the dividing line DL, that is, does not overlap with the floating diffusion FD. This is because to prevent variation of capacitance from occurring in the floating diffusion FD. In this manner, the dividing line DL overlaps with the photodiode PD1 in a region between the transfer transistor TX1 and the photodiode PD2.

Here, the direction of the shift in the active region at the level difference DP is the same as the direction of the shift of the N$^-$-type semiconductor region N1 at the level difference WD. However, the process that defines the active region AR (step S3 in FIG. 7) and the process that forms the N$^-$-type semiconductor region N1 (step S5 in FIG. 7) are different from each other and the divided exposure processing is performed in each process using a different mask, so that the direction of the shift and the amount of the shift of the level difference DP are not necessarily the same as those of the level difference WD.

Here, the configuration in which the photodiode PD1 in the pixel PE2 overlaps with the dividing line DL has been described. However, the dividing line DL may overlap with the photodiode PD2 instead of the photodiode PD1. The semiconductor device of the present embodiment can be formed by the same process as that in the first embodiment except for the position where the dividing line DL is defined. In the structure shown in FIG. 18, the length in the X axis direction of the gate electrode GE is short so that the dividing line DL and the gate electrode GE of the transfer transistor TX1 do not overlap with each other. However, the dividing line DL and the gate electrode GE may overlap with each other.

In the present embodiment, the dividing line of the divided exposure is not defined between pixels adjacent to each other, but the dividing line is defined so as to overlap with a pixel. Therefore, as compared with a case in which the dividing line is defined between pixels adjacent to each other, it is possible to prevent the insulation between elements from degrading due to a variation of the size of the element isolation region EI between pixels. Further, it is not necessary to secure a large margin of the size by considering the variation of the size of the element isolation region EI between pixels, so that it is possible to improve the performance of the solid state image sensor by reducing the size of the element isolation region EI and increasing the area of the pixel. Further, it is not necessary to increase a margin of the size of only the element isolation region EI that overlaps with the dividing line by considering the variation of the size of the element isolation region EI between pixels, so that it is possible to prevent the variation of the size of the element isolation region EI in the pixel array region.

Here, the distance L7 between the photodiode PD1 and the photodiode PD2 in the pixel PE2 shown in FIG. 18 is the same as the distance L2 between the photodiode PD1 and the photodiode PD2 in the pixel PE1 shown in FIG. 5. In the present embodiment, the dividing line DL is not defined between the photodiodes PD1 and PD2, so that it is possible to prevent the distance between the photodiodes PD1 and PD2 from being small due to a position shift of a pattern. Therefore, it is possible to prevent the automatic focusing performance of the solid state image sensor from degrading due to leakage between the photodiodes PD1 and PD2 or the like.

Further, even when a shift of a pattern formation position occurs at the boundary of the divided exposure, leakage between a plurality of pixels or a plurality of photodiodes does not occur, so that it is possible to prevent the solid state image sensor from not operating normally. In other words, in the present embodiment, the tolerance for the overlap shift of each exposure region is large as compared with a case in which the dividing line of the divided exposure is defined between pixels adjacent to each other. In particular, regarding the overlap shift in the X axis direction which is the longitudinal direction of the photodiode, even when the amount of shift is large, the area of the photodiode in a pixel does not change, so that the overlap shift does not affect so much the performance of the solid state image sensor.

Therefore, it is possible to prevent the increase in the error during an operation such as automatic focusing, so that it is possible to prevent the performance of the semiconductor device from degrading and it is possible to facilitate the manufacturing of the semiconductor device.

Further, even when the divided exposure is performed, the size of the intermediate region between the photodiodes PD1 and PD2 does not vary in the pixel PE2, so that it is not necessary to increase a margin of the size of the intermediate region. Therefore, it is possible to reduce the distance between the photodiodes PD1 and PD2 adjacent to each other. Thereby, it is possible to increase the size of each photodiode in the pixel PE2, so that the quality of images obtained by the solid state image sensor can be improved.

If the areas of the photodiodes PD1 and PD2 are small, when the photodiodes PD1 and PD2 receive light during an operation of the solid state image sensor, electrons are easily saturated in each of the N$^-$-type semiconductor regions N1 and N2, so that there is a problem that halation easily occurs in an image obtained from the pixels. However, in the present embodiment, it is possible to increase the areas of the photodiodes PD1 and PD2, so that it is possible to prevent the halation from occurring. In other words, it is possible to increase the amount of electrons that can be accumulated in the photodiodes PD1 and PD2 in the solid state image sensor of the present embodiment. Such a solid state image sensor can sense brighter light, so that it is possible to increase the dynamic range of a digital camera that uses the solid state image sensor.

As described above, in the present embodiment, it is possible to reduce the width of the element isolation region between pixels while preventing leakage between pixels, so that pixels can be densely arranged in the solid state image sensor. Therefore, it is possible to improve the performance of the semiconductor device.

While the invention made by the inventors has been specifically described based on the embodiments, the invention is not limited to the embodiments, but needless to say that the invention may be modified in various ways without departing from the scope of the invention.

Some of the contents described in the embodiments is described below.

(1) A semiconductor device including a solid state image sensor, the semiconductor device including:

a substrate including a first region and a second region adjacent to each other in an upper surface of the substrate;

a pixel including an active region partitioned by an element isolation structure in the upper surface of the substrate; and a first photodiode and a second photodiode aligned separately from each other in the active region, and in the active region, a portion formed in the first region and a portion formed in the second region are formed to be shifted from each other in one direction in plan view, a dividing line between the first region and the second region overlaps with the first photodiode and extends in a longitudinal direction of the first photodiode in plan view, and a level difference is formed in a layout of a periphery of the active region in plan view at a boundary between the first region and the second region.

What is claimed is:

1. A semiconductor device including a solid state image sensor, the semiconductor device comprising:

a substrate including a first region and a second region adjacent to each other in an upper surface of the substrate;

a pixel including an active region partitioned by an element isolation structure in the upper surface of the substrate;

a first photodiode formed in the first region in the active region; and a second photodiode formed separately from the first photodiode in the second region in the active region, wherein, in the active region, a portion formed in the first region and a portion formed in the second region are formed to be shifted from each other in one direction in plan view, and a level difference is formed in a layout of a periphery of the active region in plan view at a boundary between the first region and the second region.

2. The semiconductor device according to claim 1, wherein the boundary extends in a first direction along a main surface of the substrate, a plurality of the pixels are arranged in a second direction which is perpendicular to the first direction and which is along the main surface of the substrate, and a distance between the first photodiode and the second photodiode in the pixel that overlaps with the boundary in plan view is greater than a distance between the first photodiode and the second photodiode in the pixel that does not overlap with the boundary in plan view.

3. The semiconductor device according to claim 2, wherein a width of the first photodiode in the second direction in the pixel that overlaps with the boundary in plan view is smaller than a width of the first photodiode in the second direction in the pixel that does not overlap with the boundary in plan view.

4. The semiconductor device according to claim 3, wherein a width of the second photodiode in the second direction in the pixel that overlaps with the boundary in plan view is smaller than a width of the second photodiode in the second direction in the pixel that does not overlap with the boundary in plan view.

5. The semiconductor device according to claim 1, wherein a peripheral transistor that amplifies and outputs an electrical charge generated in the first photodiode and the second photodiode is provided in thepixel.

* * * * *